United States Patent
Pohm et al.

[11] Patent Number: 5,966,322
[45] Date of Patent: *Oct. 12, 1999

[54] GIANT MAGNETORESISTIVE EFFECT MEMORY CELL

[75] Inventors: Arthur V. Pohm, Ames, Iowa; Brenda A. Everitt, Minneapolis, Minn.

[73] Assignee: Nonvolatile Electronics, Incorporated, Eden Prairie, Minn.

[*] Notice: This patent is subject to a terminal disclaimer.

[21] Appl. No.: 08/923,478

[22] Filed: Sep. 4, 1997

Related U.S. Application Data

[63] Continuation-in-part of application No. 08/704,315, Sep. 6, 1996.

[51] Int. Cl.$^6$ ..................................................... G11C 11/15
[52] U.S. Cl. .......................... 365/158; 365/173; 257/295
[58] Field of Search ..................... 365/158, 172, 365/171, 173; 257/295

[56] References Cited

U.S. PATENT DOCUMENTS

| | | | |
|---|---|---|---|
| 5,012,444 | 4/1991 | Hurst, Jr. et al. | 365/158 |
| 5,134,533 | 7/1992 | Friedrich et al. | 360/113 |
| 5,159,513 | 10/1992 | Dieny et al. | 360/113 |
| 5,206,590 | 4/1993 | Dieny et al. | 324/252 |
| 5,343,422 | 8/1994 | Kung et al. | 365/173 |
| 5,347,485 | 9/1994 | Taguchi et al. | 365/171 |
| 5,432,373 | 7/1995 | Johnson | 257/421 |
| 5,432,734 | 7/1995 | Kawano et al. | 365/158 |
| 5,448,515 | 9/1995 | Fukami et al. | 365/171 |
| 5,459,687 | 10/1995 | Sakakima et al. | 365/158 |
| 5,477,482 | 12/1995 | Prinz | 365/129 |
| 5,549,978 | 8/1996 | Iwasaki et al. | 428/692 |
| 5,636,159 | 6/1997 | Pohm | 365/158 |
| 5,702,831 | 12/1997 | Chen et al. | 428/611 |
| 5,703,805 | 12/1997 | Tehrani et al. | 365/173 |
| 5,715,121 | 2/1998 | Sakakima | 365/158 |
| 5,734,605 | 3/1998 | Zhu et al. | 365/173 |
| 5,745,408 | 4/1998 | Chen et al. | 365/173 |
| 5,768,181 | 6/1998 | Zhu et al. | 365/158 |
| 5,768,183 | 6/1998 | Zhu et al. | 365/171 |

OTHER PUBLICATIONS

Design, Simulation, and Realization of Solid State Memory Element Using the Weakly Coupled GMR Effect: by Wang et al., *IEEE Transactions on Magnetics*, vol. 32, No. 2, Mar. 1996.

"Quarternary Giant Magnetoresistance Random Access Memory" by Wang et al., *J. Appl. Phys.*, 79 (8), Apr. 15, 1996, pp. 6639–6641.

"Analytical Model in a Weakly Coupled Sandwich for Memory Purposes" by Wang et al., *J. Appl. Phys.*, 79 (8), Apr. 15, 1996, pp 6649–6651.

"Solid–State Memory Using GMR Films" by H. Sakakima et al., Central Research Lab, Matsushita Elec. Ind. Co., Ltd., vol. 20, No. 1, 1996.

"Classical Theory of Giant Magnetoresistance in Spin–Valve Multilayers: Influence of Thicknesses, Number of Periods, Bulk and Interfacial Spin–Dependent Scattering", by B. Dieny, *J. Phys.: Condens. Matter 4* (1992) 8009–8020.

"Quantitative Interpretation of Giant Magnetoresistance Properties of Permalloy–Based Spin–Valve Structures" by B. Dieny, *Europhysics Letters*, 17 (3) pp. 261–267 (1992), Jan. 14, 1992, published Dec. 1991.

*Primary Examiner*—Tan T. Nguyen
*Attorney, Agent, or Firm*—Kinney & Lange, P.A.

[57] ABSTRACT

A digital data memory having a bit structure in a memory cell based on an intermediate separating material with two major surfaces having thereon a magnetoresistive, anisotropic ferromagnetic thin-film of differing thicknesses. These bit structures are fabricated within structural extent limits to operate satisfactorily, and are fabricated as series connected members of storage line structures. A corresponding conductive word line structure adjacent corresponding ones of these memory cells is used for selecting or operating them, or both, in data storage and retrieval operations. Bit structures can be fabricated with further alternating intermediate separating, material layers and varied thickness ferromagnetic thin-film layers, and a configuration thereof can be provided for use as an isolated memory cell.

40 Claims, 16 Drawing Sheets

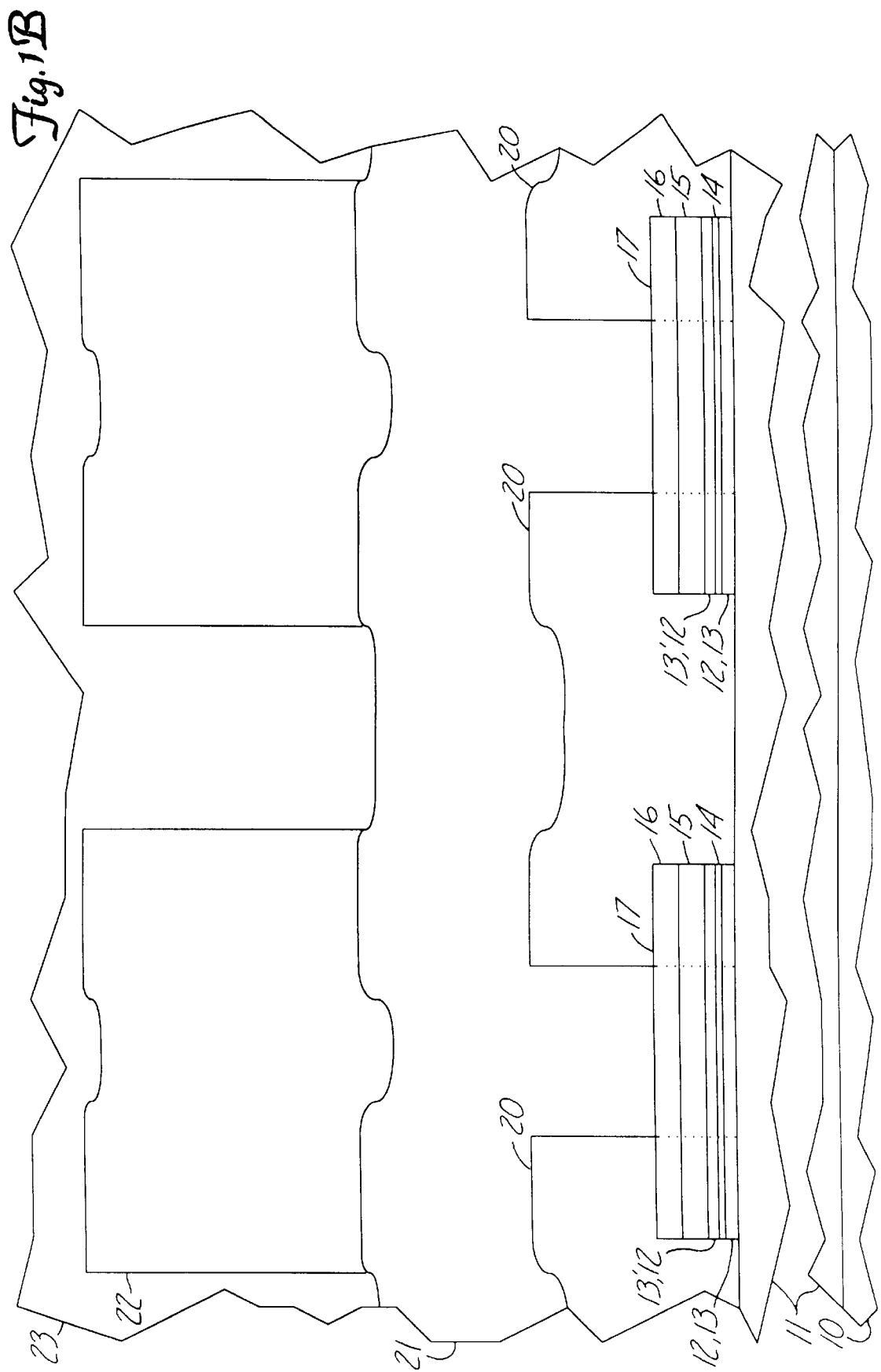

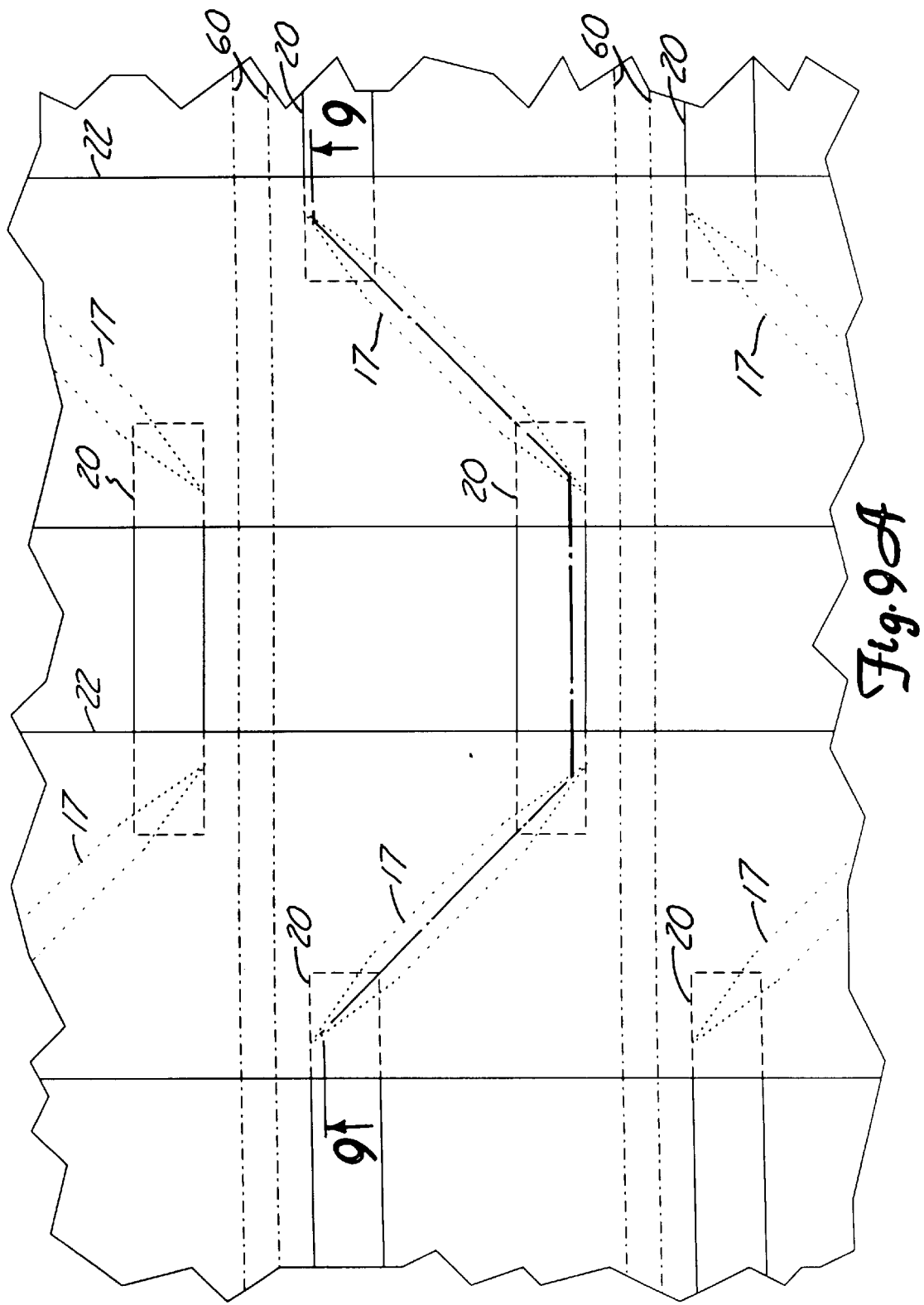

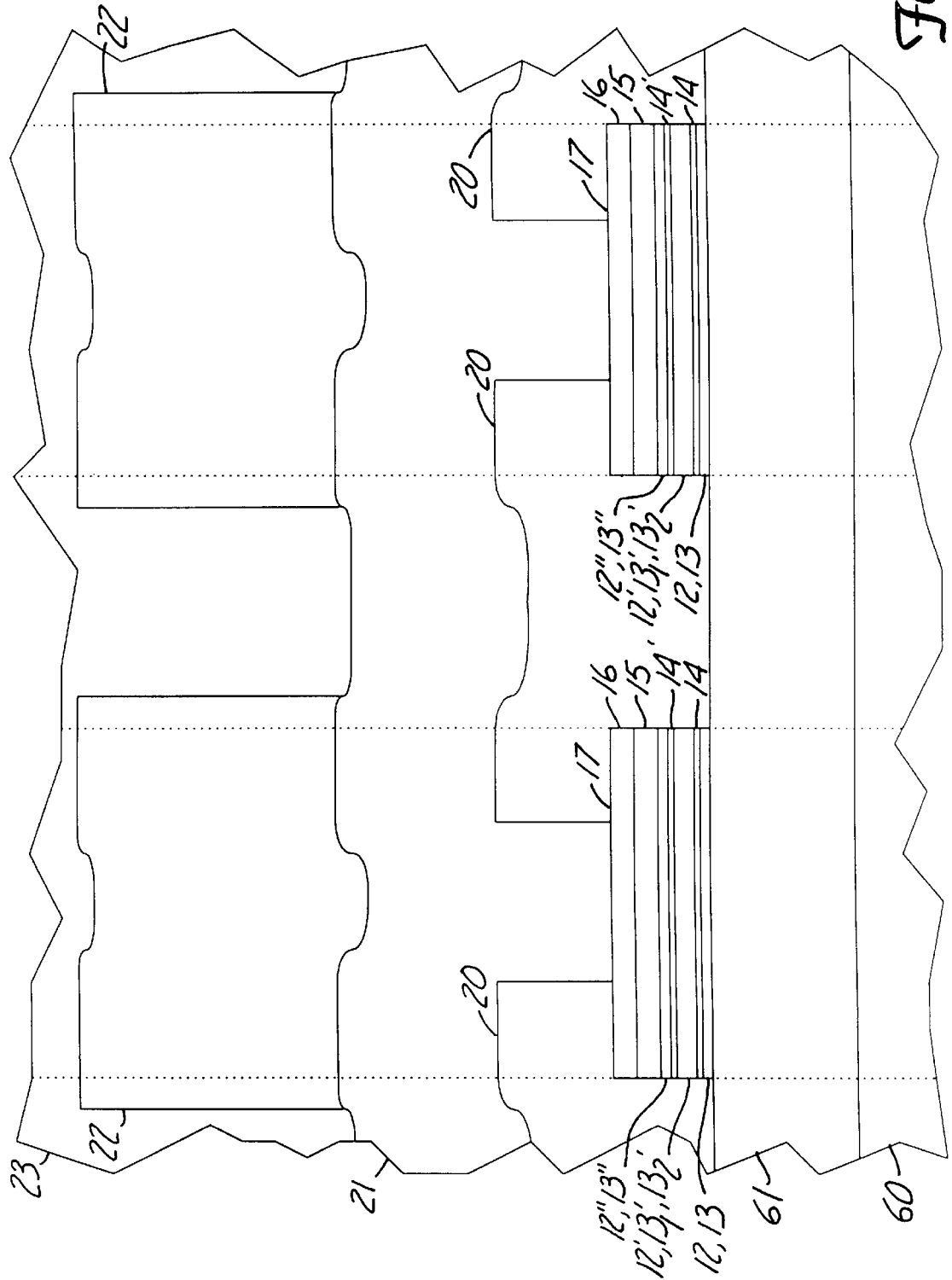

GIANT MAGNETORESISTIVE EFFECT MEMORY CELL

CROSS-REFERENCE TO RELATED APPLICATION

This is a continuation-in-part application based on application Ser. No. 08/704,315, filed Sep. 6, 1996.

This invention was made with government support under contract N00014-93-C-0251 awarded by the Department of the Navy and NSF9508538 awarded by the National Science Foundation. The government has certain rights in this invention.

BACKGROUND OF THE INVENTION

The present invention relates to ferromagnetic thin-film structures exhibiting relatively large magnetoresistive characteristics and, more particularly, to such structures used for the storage and retrieval of digital data.

Many kinds of electronic systems make use of magnetic devices including both digital systems, such as memories, and analog systems such as magnetic field sensors. Digital data memories are used extensively in digital systems of many kinds including computers and computer systems components, and digital signal processing systems. Such memories can be advantageously based on the storage of digital symbols as alternative states of magnetization in magnetic materials provided in each memory storage cell, the result being memories which use less electrical power and do not lose information upon removals of such electrical power.

Such memory cells, and magnetic field sensors also, can often be advantageously fabricated using ferromagnetic thin-film materials, and are often based on magnetoresistive sensing of magnetic states, or magnetic conditions, therein. Such devices may be provided on a surface of a monolithic integrated circuit to provide convenient electrical interconnections between the device and the operating circuitry therefor.

Ferromagnetic thin-film memory cells, for instance, can be made very small and packed very closely together to achieve a significant density of information storage, particularly when so provided on the surface of a monolithic integrated circuit. In this situation, the magnetic environment can become quite complex with fields in any one memory cell affecting the film portions in neighboring memory cells. Also, small ferromagnetic film portions in a memory cell can lead to substantial demagnetization fields which can cause instabilities in the magnetization state desired in such a cell.

These magnetic effects between neighbors in an array of closely packed ferromagnetic thin-film memory cells can be ameliorated to a considerable extent by providing a memory cell based on an intermediate separating material having two major surfaces on each of which an anisotropic ferromagnetic memory thin-film is provided. Such an arrangement provides significant "flux closure," i.e. a more closely confined magnetic flux path, to thereby confine the magnetic field arising in the cell to affecting primarily just that cell. This result is considerably enhanced by choosing the separating material in the ferromagnetic thin-film memory cells to each be sufficiently thin. Similar "sandwich" structures are also used in magnetic sensors.

In the recent past, reducing the thicknesses of the ferromagnetic thin-films and the intermediate layers in extended "sandwich" structures, and adding possibly alternating ones of such films and layers, i.e. superlattices, have been shown to lead to a "giant magnetoresistive effect" being present in some circumstances. This effect yields a magnetoresistive response which can be in the range of up to an order of magnitude greater than that due to the well known anisotropic magnetoresistive response.

In the ordinary anisotropic magnetoresistive response, varying the difference occurring between the direction of the magnetization vector in a ferromagnetic thin-film and the direction of sensing currents passed through that film leads to varying effective electrical resistance in the film in the direction of the current. The maximum electrical resistance occurs when the magnetization vector in the field and the current direction therein are parallel to one another, while the minimum resistance occurs when they are perpendicular to one another. The total electrical resistance in such a magnetoresistive ferromagnetic film can be shown to be given by a constant value, representing the minimum resistance, plus an additional value depending on the angle between the current direction in the film and the magnetization vector therein. This additional resistance has a magnitude characteristic that follows the square of the cosine of that angle.

Operating magnetic fields imposed externally can be used to vary the angle of the magnetization vector in such a film portion with respect to the easy axis of that film. Such an axis comes about in the film because of an anisotropy therein typically resulting from depositing the film during fabrication in the presence of an external magnetic field oriented in the plane of the film along the direction desired for the easy axis in the resulting film. During subsequent operation of the device having this resulting film, such operational magnetic fields imposed externally can be used to vary the angle to such an extent as to cause switching of the film magnetization vector between two stable states which occur for the magnetization being oriented in opposite directions along the film's easy axis. The state of the magnetization vector in such a film can be measured, or sensed, by the change in resistance encountered by current directed through this film portion. This arrangement has provided the basis for a ferromagnetic, magnetoresistive anisotropic thin-film to serve as a memory cell.

In contrast to this arrangement, the resistance in the plane of a ferromagnetic thin-film is isotropic for the giant magnetoresistive effect rather than depending on the direction of the sensing current therethrough as for the anisotropic magnetoresistive effect. The giant magnetoresistive effect involves a change in the electrical resistance of the structure thought to come about from the passage of conduction electrons between the ferromagnetic layers in the "sandwich" structure, or superlattice structure, through the separating non-magnetic layers with the resulting scattering occurring at the layer interfaces, and in the ferromagnetic layers, being dependent on the electron spins. The magnetization dependant component of the resistance in connection with this effect varies as the sine of the absolute value of half the angle between the magnetizations in the ferromagnetic thin-films provided on either side of an intermediate non-magnetic layer The electrical resistance in the giant magnetoresistance effect through the "sandwich" or superlattice structure is lower if the magnetizations in the separated ferromagnetic thin-films are parallel and oriented in the same direction than it is if these magnetizations are antiparallel, i.e. oriented in opposing or partially opposing directions. Further, the anisotropic magnetoresistive effect in very thin films is considerably reduced from the bulk values therefor in thicker films due to surface scattering, whereas a significant giant magnetoresistive effect is obtained only in very thin films. Nevertheless, the anisotropic magnetoresistive effect remains present in the films used in giant magnetoresistive effect structures.

As indicated above, the giant magnetoresistive effect can be increased by adding further alternate intermediate non-magnetic and ferromagnetic thin-film layers to extend a "sandwich" structure into a stacked structure, i.e. a superlattice structure. The giant magnetoresistive effect is sometimes called the "spin valve effect" in view of the explanation that a larger fraction of conduction electrons are allowed to move more freely from one ferromagnetic thin-film layer to another if the magnetizations in those layers are parallel than if they are antiparallel or partially antiparallel to thereby result in the magnetization states of the layers acting as sort of a "valve."

Thus, a digital data memory cell based on the use of structures exhibiting the giant magnetoresistive effect is attractive as compared to structures based on use of an anisotropic magnetoresistive effect because of the larger signals obtainable in information retrieval operations with respect to such cells. Such larger magnitude signals are easier to detect without error in the presence of noise thereby leading to less critical requirements on the retrieval operation circuitry.

A memory cell structure suitable for permitting the storing and retaining of a digital bit of information, and for permitting retrieving same therefrom has been demonstrated based on a multiple layer "sandwich" construction in a rectangular solid. This cell has a pair of ferromagnetic layers of equal thickness and area separated by a non-magnetic layer of the same area but smaller thickness. These ferromagnetic layers are each a composite layer formed of two stratums each of a different magnetic material, there being a relatively thin ferromagnetic stratum in each of the composite layers adjacent the non-magnetic layer and a thicker ferromagnetic stratum in each of the composite layers adjacent the thin ferromagnetic stratum therein. The ferromagnetic material of the thick stratum in one of the composite layers is the same as that in the thin stratum in the other composite layer, and the ferromagnetic material of the thin stratum in the first composite layer is the same as the ferromagnetic material in the thick stratum of the second composite layer. Each of the composite layers is fabricated in the presence of a magnetic field so as to result in having an easy axis parallel to the long sides of the rectangular solid. The dimensions of the cell structure were 10 µm in length and 5 µm in width with a non-magnetic layer of thickness 30 Å. The composite ferromagnetic layers are each formed of a 5 Å thin stratum and a 50 Å thick stratum.

Thus, this memory cell structure has a pair of ferromagnetic layers of the matching geometries but different magnetic materials in the strata therein to result in one such layer having effectively a greater saturation magnetization and a greater anisotropy field than the other to result in different coercivities in each. In addition, the structure results in a coupling of the magnetization between the two ferromagnetic layers therein due to exchange coupling between them leading to the magnetizations in each paralleling one another in the absence of any applied magnetic fields. As a result, the electrical resistance of the cell along its length versus applied magnetic fields in either direction parallel thereto is represented by two characteristics depending on the magnetization history of the cell. Each of these characteristics exhibits a peak in this resistance for applied longitudinal fields having absolute values that are somewhat greater than zero, one of these characteristics exhibiting its peak for positive applied longitudinal fields and the other characteristic exhibiting its peak for negative applied longitudinal fields The characteristic followed by the resistance of the cell for relatively small applied longitudinal fields depends on which direction the magnetization is oriented along the easy axis for the one of the two ferromagnetic layers having the larger coercivity. Thus, by setting the magnetization of the layer with the higher coercivity, a bit of digital information can be stored and retained, and the value of that bit can be retrieved without affecting this retention through a determination of which characteristic the resistance follows for a relatively small applied longitudinal field.

Such memory cell behavior for this structure can be modeled by assuming that the ferromagnetic layers therein are each a single magnetic domain so that positioning of the magnetization vectors in the ferromagnetic layers is based on coherent rotation, and that uniaxial anisotropies characterize those layers. The angles of the magnetization vectors in the two ferromagnetic layers with respect to the easy axis in those layers are then found by minimizing the magnetic energy of these anisotropies summed with that due to the applied external fields and to exchange coupling. That total energy per unit volume is then $$\begin{aligned} E_{Tot} &= E_1 + E_2 + E_{12} \\ &= K_{u_1}\sin^2\theta_1 - M_{s_1}H\cos(\psi - \theta_1) + \\ &\quad K_{u_2}\sin^2\theta_2 - M_{s_2}H\cos(\psi - \theta_2) + A_{12}\cos(\theta_1 - \theta_2). \end{aligned}$$

As indicated above, once the magnetization vectors have taken an angular position with respect to the easy axis of the corresponding layer at a minimum in the above indicated energy, the effective resistance between the ends of the memory cell structure is determined by the net angle between the magnetization vectors in each of these layers.

Because of the assumption of single domain behavior in the ferromagnetic layers, the above equation would seemingly be expected to improve its approximation of the system total magnetic energy as the length and width of that memory cell structure decreased toward having submicron dimensions. However, this mode of operation described for providing the two magnetoresistive characteristics based on the history of the magnetization, in depending on the differing anisotropy fields in the two ferromagnetic layers because of the differing materials used therein, becomes less and less reliable as these dimensions decrease. This appears to occur because decreasing the cell dimensions gives rise to larger and larger demagnetizing fields in the two ferromagnetic layers which, at some point, overwhelm the effects of the anisotropy fields so that the above described behavior no longer occurs as described. In addition, the magnetizations of the two ferromagnetic layers rotate together under the influences of externally applied fields at angles with respect to the corresponding easy axis at angular magnitudes much more nearly equal to one another because of the increasing demagnetization fields in these layers as the dimensions thereof decrease. As a result, these ferromagnetic layers are less and less able to have the magnetizations thereof switch directions of orientation independently of one another as the dimensions thereof decrease so that the structure they are in becomes less able to provide the above described memory function in relying on only these ferromagnetic layer anisotropy differences. Thus, an alternative arrangement is desired for such "sandwich" structure, or superlattice structure, memory cells having submicron dimensions which provide desirable magnetoresistance versus applied magnetic field characteristics that can be used for storing and retrieving data bits of information.

SUMMARY OF THE INVENTION

The present invention provides a digital data memory having a bit structure in a memory cell based on an intermediate separating material with two major surfaces on each of which there is a magnetoresistive, anisotropic ferromagnetic thin-film but of differing thicknesses. The ferromagnetic film at each such surface is a composite film having a thinner stratum of higher magnetic saturation induction adjacent the intermediate material and a thicker stratum of lower magnetic saturation induction. These bit structures are fabricated within structural extent limits to operate satisfactorily, and can be fabricated as series connected members of storage line structures. A corresponding conductive word line structure for each of such memory cells is positioned adjacent the ferromagnetic film on one of these surfaces but separated therefrom for use in selecting or operating corresponding ones of these memory cells, or both, in data storage and retrieval operations. Such bit structures can also be fabricated with further alternating intermediate separating material layers and ferromagnetic thin-film layers which films can have different thicknesses, and a configuration thereof can be provided for use as an isolated memory cell.

BRIEF DESCRIPTION OF THE DRAWINGS

FIGS. 1A and 1B represent a plan view of a portion of a monolithic integrated circuit structure embodying the present invention and a layer diagram of a part of this structure, FIGS. 9A and 9B represent a plan view of a portion of a monolithic integrated circuit structure corresponding to the alternative embodiment of FIG. 8C and a layer diagram of a part of this structure, FIG. 10 represents a characteristic diagram for a structure similar to a version of that shown in, FIG. 8C, FIGS. 11A, 11B and 11C represent characteristic diagrams for structures similar to one of those shown FIGS. 8A, 8C and 8B, FIGS. 12A, and 12B represent characteristic diagrams for structures similar to one of those shown in FIG. 8B.

DETAILED DESCRIPTION OF THE PREFERRED EMBODIMENTS

A digital data bit storage and retrieval memory cell suited for fabrication with submicron dimensions can be fabricated using ferromagnetic thin-film materials of similar kinds in each of the magnetic memory films used in a giant magnetoresistive "sandwich" structure on either side of an intermediate nonmagnetic layer, but with different thicknesses in those films at each major surface of the intermediate layer. Such devices may be provided on a surface of a monolithic integrated circuit to thereby allow providing convenient electrical connections between the memory cell device and the operating circuitry therefor.

A "sandwich" structure for such a memory cell, based on having an intermediate thin layer of a non-magnetic separating material with two major surfaces on each of which a magnetoresistive, anisotropic ferromagnetic thin-film is positioned, exhibits the "giant magnetoresistive effect" if the materials for the ferromagnetic thin-films and the intermediate layers are properly selected and have sufficiently small thicknesses. This effect can be enhanced by forming such cells of additional alternating ones of these ferromagnetic films and intermediate layers to form superlattices. The resulting enhanced "giant magnetoresistive effect" can yield a magnetoresistive response which can be in the range of up to an order of magnitude greater than that due to the well known anisotropic magnetoresistive response. Giant magnetoresistive effect structures are described in earlier filed copending applications by J. M. Daughton entitled "Magnetoresistive Structure With Alloy Layer" having Ser. No. 08/384,647 and "Magnetic Structure with Stratified Layers" having Ser. No. 08/096,765 both of which are assigned to the same assignee as the present application and are hereby incorporated herein by reference.

Figure 1A:
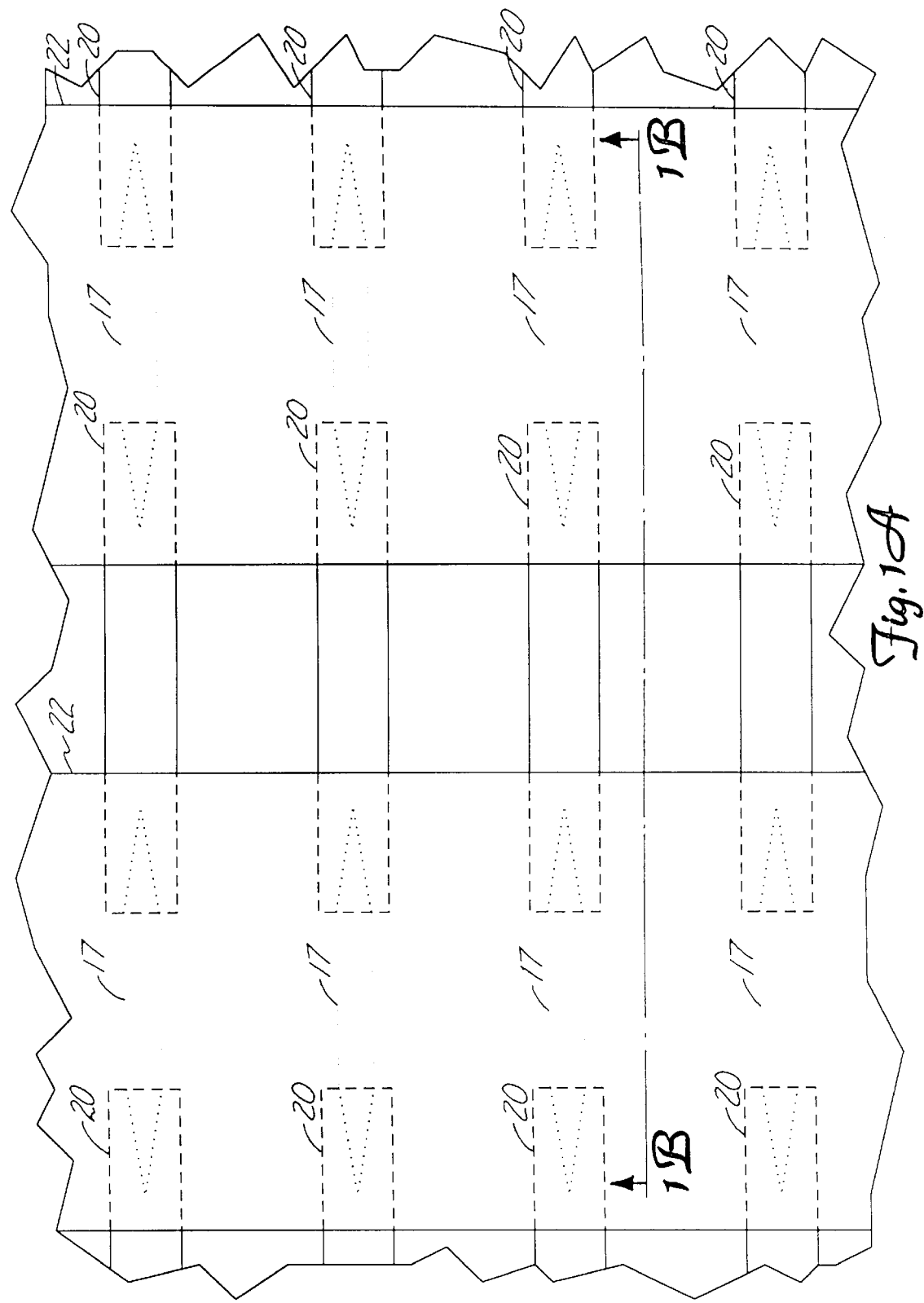

FIG. 1A shows a plan view of an example of such memory cells as a part of a digital memory formed as a portion of a monolithic integrated circuit, including a supporting semiconductor chip as part of the memory substrate, which can have conveniently provided therein the operating circuitry for this memory. FIG. 1B shows a fragmentary view of a portion of the view shown in FIG. 1A to show the layered structure thereof and also has parts thereof broken out to show some the structure therebelow again for greater clarity. The protective layer provided over portions of the structure shown in FIG. 1A in actual use has been omitted in this view for clarity, but that layer is shown in part in FIG. 1B. Certain other portions of some layers have been omitted, again for clarity, so that the structure portions present are shown in solid line form if they are exposed in the absence of some layer thereover now omitted, but with other structure portions beneath the solid line form portions appearing in these figures being shown in dashed line form.

Figure 2:
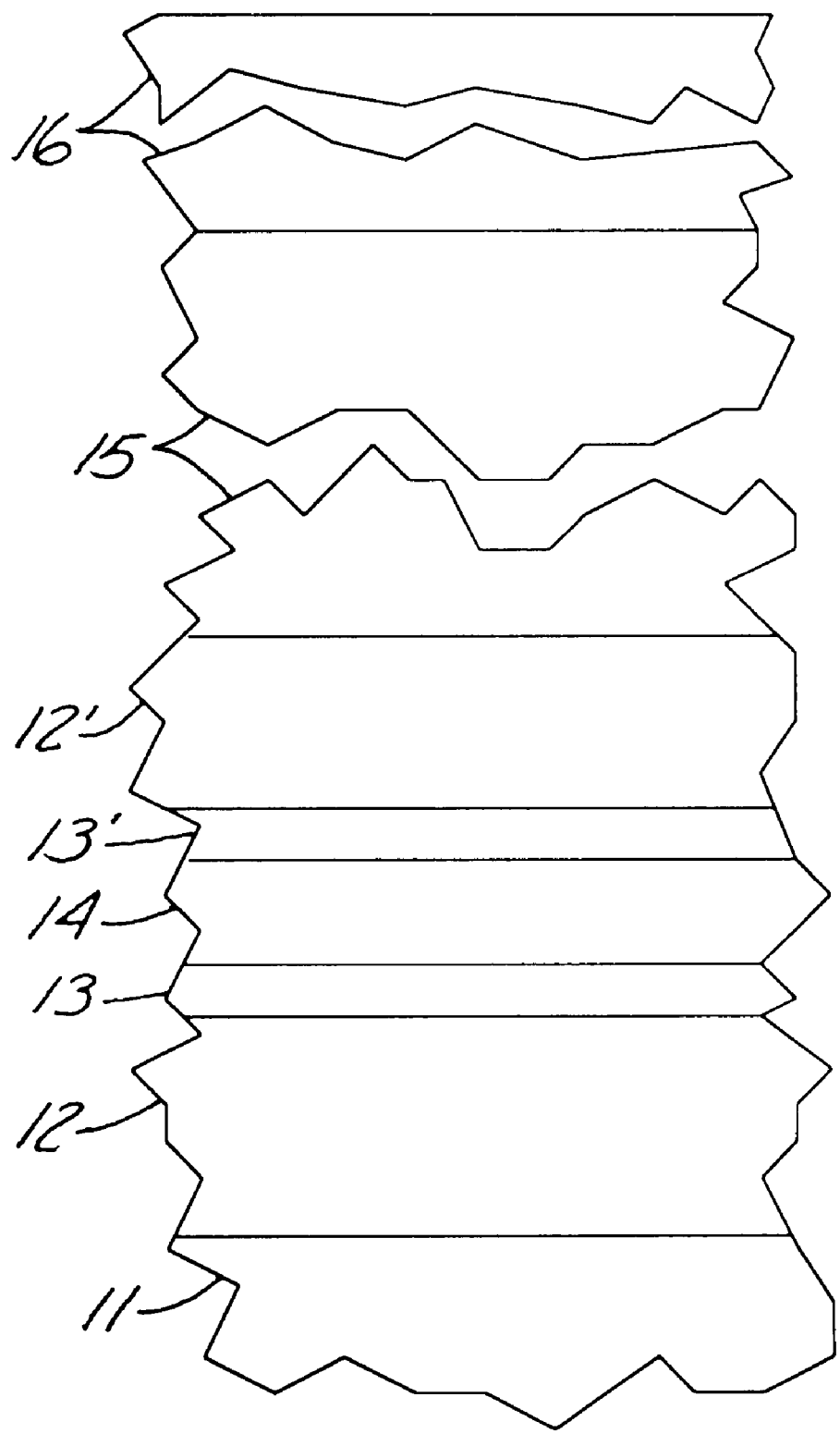
FIG. 2 represents a fragmentary portion of the layer diagram of FIG. 1B.

Corresponding to FIGS. 1A and 1B is FIG. 2 which is a layer diagram of a corresponding portion of the structure shown in FIGS. 1A and 1B. This layer diagram gives an indication of the structural layers leading to portions of the structure shown in FIGS. 1A and 1B, but FIGS. 1B and 2 are not true cross section views in that many dimensions therein are exaggerated or reduced for purposes of clarity.

As indicated above, the memory cell structures are typically provided on a semiconductor chip, 10, having suitable operating circuitry for the memory provided therein. An electrical insulating layer, 11, formed on semiconductor chip 10 by sputter deposition of silicon nitride, supports memory cell "sandwich" structures comprising a pair of ferromagnetic thin-film layers that are separated from one another by a non-magnetic, electrically conductive intermediate layer as will be described in more detail below. A portion of just layer 11 is shown in the higher resolution drawing of FIG. 2. Typically, layer 11 is formed by the this silicon nitride deposited to a thickness of about 10,000 Å.

Thereafter, the "sandwich" structures mentioned above are provided on layer 11 with each of the ferromagnetic thin-film layers and the intermediate layer being provided through sputter deposition as the basis for forming the magnetoresistive memory cell. This multilayer structure will have a sheet resistivity of approximately 12 Ω/□, or higher, and will exhibit a giant magnetoresistive effect exceeding 5%.

In this structure, the first layer provided is a composite ferromagnetic thin-film layer sputter deposited onto nitride layer 11 with the result shown in FIG. 2. A first stratum, 12, of this composite ferromagnetic thin-film layer is formed of an alloy of 65% nickel, 15% iron and 20% cobalt deposited to a thickness of 40 Å which has a magnetic saturation induction of typically about 10,000 Gauss. The deposition of this layer occurs in the presence of an external magnetic field in the plane of the film oriented along a direction parallel to the plane of the figure in FIG. 1A, and this process results in the deposited film having a face-centered cubic structure. This fabrication magnetic field will leave the easy axis of the film directed along the plane of that figure.

A second stratum, 13, is also provided in a sputter deposition step in the presence of a similar fabrication magnetic field. Second stratum 13 is formed of 5% iron and 95% cobalt to a thickness of 15 Å resulting in this material having a magnetic saturation induction of approximately 16,000 Gauss which is a higher value than that of the magnetic saturation induction of first stratum 12. This higher saturation material is provided adjacent the intermediate layer, which is next to be formed, to obtain a greater giant magnetoresistive effect, but the lower saturation value in stratum 12 is provided to keep the resulting composite film more sensitive to smaller fields than it would be in its absence. This composite layer is designated 12, 13 in FIG. 1B.

Thereafter, an intermediate layer, 14, is provided by sputter deposition onto layer 13, this intermediate layer being electrically conductive but non-magnetic. Layer 14 is typically formed of copper to a thickness of 30 Å. The provision of layer 14 is followed by a second composite ferromagnetic thin-film layer that is provided on layer 14, and its structure matches that of the first composite ferromagnetic layer comprising strata 12 and 13, except for being thinner and reversed in strata order, because of the use of essentially the same deposition steps. As a result, the stratum having the greater magnetic saturation induction is again adjacent to layer 14 in this second composite layer, and the lesser magnetic saturation induction stratum is provided thereon but with a thickness of only 25 Å. Since the strata are otherwise the same, they have been designated in FIG. 2 as 13' and 12' in correspondence to strata 13 and 12.

After completing this "sandwich" structure, a 200 Å layer of tantalum or tantalum nitride is sputter deposited on stratum 12' to passivate and protect stratum 12' therebelow, and to allow electrical interconnections thereto for circuit purposes. The resulting layer, 15, of tantalum or tantalum nitride, because of its conductivity, leads to the occurrence of some shunting away of current from the rest of the memory cell to thereby result in an effective reduction of the giant magnetoresistive effect achieved by the constructed cell. Layer 15 is shown in broken form in FIG. 2 because of its significantly greater thickness compared to the ferromagnetic composite layers and the non-magnetic intermediate layer.

Similarly, a further layer, 16, is deposited on layer 15, and is shown in broken form in FIG. 2 because of its relatively greater thickness of 100 Å. Layer 15 is first sputter cleaned which removes around 75 Å thereof. Then, layer 16 is sputter deposited on clean layer 15 as a chrome silicon layer with 40% chrome and 60% silicon to serve as an etch stop for the subsequent etching of a layer to be provided thereover as a milling mask.

That is, another layer of silicon nitride is sputter deposited on layer 16 to a depth of 1000 Å to be used as a milling mask, but this layer is not shown in FIG. 2 because its remnants will be incorporated in a further insulating layer to be provided later. On this silicon nitride mask layer, photoresist is deposited and patterned in such a way as to form a pattern for an etching mask which is to be formed following that pattern by leaving the masked portions of the silicon nitride layer therebelow after etching. This last masking pattern in the silicon nitride is to result, after milling therethrough to remove the exposed ferromagnetic and non-magnetic layers therebelow, in a substantial number of separated bit structures to serve as the memory cells in the digital memory each with a "sandwich" construction. Reactive ion etching is used with the patterned photoresist to remove the exposed portions of the silicon nitride masking layer down to chrome silicon layer 16 serving as an etch stop. The remaining portions of the silicon nitride layer protected by the photoresist serve as the above mentioned milling mask for the subsequent ion milling step which removes the exposed portions of chrome silicon layer 16, and thereafter, also the then exposed portions of layer 15 the next exposed portions of the second composite ferromagnetic thin-film layer formed as strata 13' and 12', the subsequently exposed portions of intermediate nonmagnetic layer 14' and, finally, the resultingly exposed portions of the first composite ferromagnetic thin-film layer formed as strata 13 and 12 down to silicon nitride layer 11.

A portion of one of the resulting memory cells, 17, from FIG. 1A is shown in FIG. 2, and has counterparts thereof shown in FIG. 1B (where they are designated again by numeral 17) with only some of the layers in each such cell being represented as distinct in this latter figure. The full multilayer structure that is shown in FIG. 2 with the distinct strata in the composite ferromagnetic layers is not shown used in FIG. 1B because of the larger scale in that manner in the figure. Some of these memory cells can also be seen in the plan view of FIG. 1A, and each of such structures is also designated by numeral 17 in that figure. The easy axes of the ferromagnetic thin-film composite layers in each of memory cells 17 are parallel to the direction of longest extent in those structures. Each memory cell structure 17 is formed with a rectangular central portion in this plan view and with a triangular portion tapering away therefrom at each end.

Following the completion with memory cell structures 17, a first layer of metal for circuit interconnections is provided beginning with sputter cleaning to remove approximately half the thickness of the exposed portions of chrome silicon layer 16. This cleaning is followed by sputter depositing a layer of aluminum alloyed with 2% copper over memory cell structure 17 and the exposed portions of substrate 11 to result in this layer being electrically conductively connected to structures 17. Photoresist is provided over this metal layer and patterned to expose unwanted portions thereof which are subsequently removed by reactive ion etching. This step results in bit junction metal structures, 20, as seen in FIG. 1B, which electrically interconnect to one another adjacent ones of memory cell structures 17 occurring in the same row therewith by overlaying the adjacent triangular end portions of each.

These interconnected rows of bit structures, interconnected by the metal in the bit junction structures in that row, each form a storage line structure permitting the passing of an electrical current through all of those memory cell structures 17 and bit junctions 20 occurring in that row. Portions of such storage line structures can be seen in FIG. 1A where the rows forming those structures extend from left to right and contain memory cell structure 17 interconnected by bit junction structures 20. Also, openings will have been provided in substrate layer 11 and in some insulating layers therebelow prior to the deposition of the metal used to form bit junction structures 20 to allow interconnection of the storage line structures to the electronic circuitry in integrated circuit 10 therebelow.

The completion of bit junction structures 20 is followed by depositing another layer of typically 7500 Å of silicon nitride thereover, and over the exposed portions of memory cell structures 17 and of layer 11, to form an insulating layer, 21. Photoresist is provided over insulator layer 21 as an etching mask to provide via openings therethrough, and through silicon nitride layer 11 and appropriate ones of the insulating layers in integrated circuit 10.

On insulator layer 21, so prepared, a further metal deposition is made, again of aluminum alloyed of 2% copper, to cover that layer and fill the openings therein, and in silicon nitride layer 11 and the insulating layers in integrated circuit 10. This metal layer is typically deposited to a thickness of 3500 Å. Photoresist is spread thereover with openings therein where the unwanted portions of that metal layer are to be eliminated, and reactive ion etching is undertaken to provide this elimination of unwanted metal layer portions. The structures that result from this elimination are shown in FIG. 1B, and in FIG. 1A, as a plurality of word lines, 22, for the memory each positioned across insulating layer 21 from a corresponding memory cell structure 17 in each of the storage lines. As a result of the via openings, these word lines are also interconnected with electronic circuitry in integrated circuit 10 therebelow.

A further insulator layer, 23, is provided by sputter depositing 7500 Å of silicon nitride over word lines 22 and the exposed portions of insulator layer 21. Insulator layer 23 serves as a passivation and protection layer for the device structure therebelow. Layer 23 is seen in FIG. 1B but is not shown in FIG. 1A to avoid obscuring that figure.

The fabrication steps just described are, of course, applied to semiconductor material wafers having many integrated circuit chips therein to serve as memory substrates so that many such digital memories can be fabricated simultaneously in and on such wafers. Once all of memory cell structures 17 are fabricated on each chip substrate, along with all of the associated bit juncture structures and word lines structures as protected by the final insulating layer, the wafers are then ready for wafer testing, separating the individual devices into separate chips and packaging them.

The plan view of the shapes of bit structure 17, i.e. having a rectangular center portion at opposite ends thereof tapering into triangular end portions, are not the only plan view geometrical shapes which can be used. An alternative would be to form memory cell structure 17 with a plan view geometry following a parallelogram, and have the bit junction structures covering the angled ends of the parallelogram so as to leave a central rectangular section uncovered by bit junction structures just as was done for the memory cell storage line structures of FIG. 1A. In a further alternative, for instance, memory cell structures 17 and bit junction structures 20 need not have their longest dimensions parallel with one another, but instead could form a meander storage line structure with succeeding ones of said bit junction structures 20 offset from one another and from the axis of extent of the storage line on opposite sides thereof In this circumstance, memory cell structures 17 would then be oriented at an angle to this axis of extent to connect successive offset bit junction structures. Such an arrangement can improve the packing density of memory cell structures on an integrated circuit chip substrate.

Figure 3:
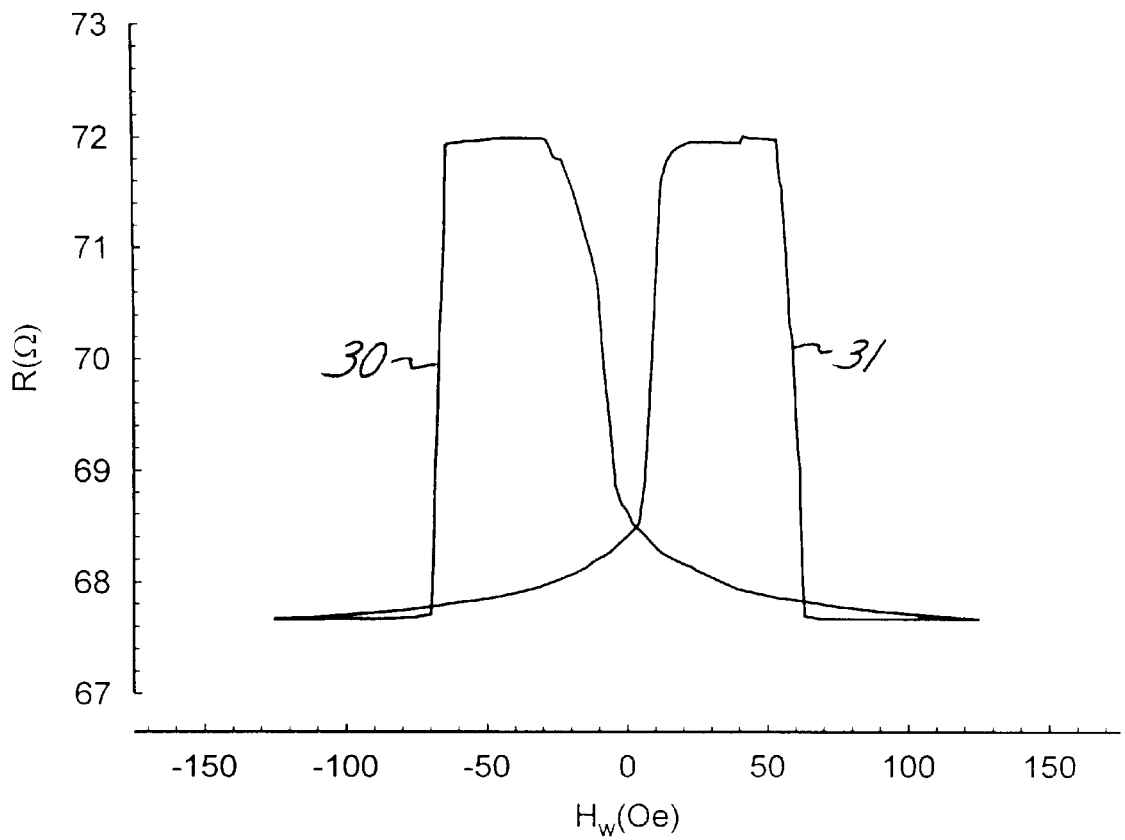
FIG. 3 shows a characteristic diagram for a structure similar to one of those shown in FIGS. 1A, 1B and 2, FIGS. 4A and 4B represent characteristic diagrams for structures similar to one of those shown in FIGS. 1A, 1B and 2, FIGS. 5A and 5B represent a plan view of a structure from FIGS. 1A, 1B and 2, and an approximation thereof.

A representation of a pair of typical magnetoresistance characteristics of a memory cell or bit structure 17 versus external magnetic fields applied long its length, i.e. along its easy axis, is shown in FIG. 3 for a bit structure example from a storage line structure having ten such bit structures therein. Memory cells 17 in this example are 2.2 $\mu$m long and 0.4 $\mu$m wide with those bit junction structures 20 interconnecting thereto overlapping 0.6 $\mu$m on each end thereof. Thicker composite layer 12, 13 has a 55 Å thick stratum 12 and a 15 Å thick stratum 13. Thinner composite layer 13', 12' has a 45 Å thick stratum 12' and a 15 Å thick stratum 13'. Intermediate layer 14 separating these composite ferromagnetic layers is 30 Å thick. A fixed sense current of 0.5 mA is used as the sense line current established through the storage line structure between the end terminal regions thereof flowing through each of those bit structures in that storage line structure. This known current, along with the measured voltage across the cell (or the storage line structure) provides the resistance of the cell.

The characteristic, 30, having the peak on the left in FIG. 3 develops from initially having a sufficiently large magnetic field parallel to the easy axis (shown as a positive field on the plot) applied via current in the adjacent word line 22 to force the magnetizations in each of the ferromagnetic thin-films 12, 13 and 13', 12' in the memory cell or bit structure 17 to be oriented in the direction of the field. These magnetizations will thus be parallel to one another pointing in an initial common direction to thereby leave the electrical resistance of the cell at a minimum (here, approximately 67.7 $\Omega$). This initial condition is followed by continually reducing this field toward zero and then reversing the field direction, after which the magnitude of the field is continually increased (shown as a negative field on the plot). As can be seen in the plot, this action begins to increase the resistance of the cell as the magnetization of thinner layer 13', 12' begins to rotate toward the opposite direction at a greater angular rate than does the magnetization of thicker layer 12, 13. As a result, these magnetizations begin to be directed more and more away from one another as the field gets increasingly negative, thereby increasing the cell resistance, until the magnetization of the thinner layer is rotated just past 90° from the easy axis, whereupon it abruptly switches (at approximately −7 Oe) to being significantly directed in the opposite direction from that of the thicker layer as it attempts to align with the word line current generated field. At that point, the resistance value correspondingly increases abruptly to the peak value shown of approximately 72 $\Omega$.

As memory cells 17 are fabricated sufficiently small to be considered as having the composite layer ferromagnetic thin-films used therein to be single magnetic domain structures, the critical magnetic field magnitude (−7 Oe), or threshold, for the thinner layer at which such switching occurs (a threshold found much like the well known Stoner- Wohlfarth threshold which is defined for larger area films not subject to exchange coupling and edge effects) is determined from layer magnetic energy considerations including the magnitude of the magnetic field established by the sense current in addition to that established by the word line current. Further magnitude increases of the negative field do not, however, cause the magnetization of the thicker layer to switch to being directed in the opposite direction at the expected Stoner-Wohlfarth threshold therefor because the previous switching of the magnetization direction of the thinner layer inhibits the switching of the magnetization of the thicker layer. The change in the direction of magnetic field occurring in the thicker layer due to the magnetization of the thinner layer coupled thereto, because of having been previously switched in direction, acts against the switching of the magnetization of the thicker layer to effectively increase its switching threshold.

The magnitude of the magnetic field in the thicker layer due to the magnetization of the thinner layer (and vice verse) depends on the demagnetization fields in these layers, thus allowing, by selecting the sense current magnitude and the memory cell geometry to achieve an appropriate demagnetization factor value, the setting of the degree of switching inhibition. That is, the width of the peak in characteristic 30 can effectively be set by the cell design and operating conditions. Once this elevated magnitude threshold value (approximately −70 Oe) for the thicker layer is exceeded by the magnitude of the applied magnetic field to force its magnetization direction past 9° from the easy axis, the magnetization of this layer also switches to result in the magnetizations of the two ferromagnetic thin-film layers again being oriented in a common direction (although opposite to the initial direction) to thereby sharply lower the resistance value from the peak value of approximately 72 $\Omega$ to the relatively lower value shown of again about 67.7 $\Omega$. Further increases in the magnitude of the negative field do not significantly further change the resistance value as the magnetization directions in each layer are forced slightly closer and closer to a common direction. Since the direction of magnetization of thicker layer 12, 13 can only be switched by fields having magnitudes greater than those that switch the magnetization direction of thinner layer 13', 12', the direction of magnetization of thicker layer 12, 13 effectively determines the binary value, "0" or "1", of the data bit stored in the cell.

Hence, traversing this large portion of characteristic 30 shown in FIG. 3 by changing the externally applied magnetic field due to word line current from a relatively large positive magnitude to a relatively large negative magnitude in the presence of a sufficient sense line current is equivalent to changing the magnetic state of both layers from pointing in one direction to pointing in the opposite direction, i.e. to storing a new data bit by changing the previously stored data therein based on the direction of the magnetization from its initial direction and binary value to another direction and value. If the initially stored data bit value was the same as the new value to be stored, the corresponding increase in the externally applied field magnitude in the opposite direction to store this new data bit, i.e. the increasing of the field in a positive direction rather than in the negative direction as described above, would not cause traversing the peak in characteristic 30 thus leaving the layer magnetizations direction and the data bit value unchanged.

The remaining characteristic, 31, in FIG. 3 develops just as did characteristic 30 if started from where the development of characteristic 30 terminated as described above, that is, by applying a positively increasing magnitude field in the presence of a sufficient sense current based field magnitude after the occurrence of a large magnitude negative field. Again, the peak in the cell resistance arises in this characteristic by first encountering a threshold like and near to a Stoner-Wohlfarth threshold for switching thinner ferromagnetic layer 13', 12' (approximately 8 Oe) to increase the cell resistance from again about 67.7 $\Omega$ to around 72 $\Omega$, and thereafter encountering the elevated magnitude threshold for switching thicker layer 12, 13 (approximately 55 Oe) to decrease the cell resistance back to about 67.7 $\Omega$. Thus, storing a data bit of either a "0" or a "1" value binary in a memory cell 17 having the characteristic shown in FIG. 3, as represented by the orientation direction of the magnetization of thicker layer 12, 13 along its easy axis in the scheme just described, requires the application of a sufficient magnitude word line field in the corresponding direction along that axis in the presence of a sufficient magnitude sense field.

Retrieving the stored data without disrupting the value of that data is easily done in a memory cell or bit structure 17 having characteristics 30 and 31, the current one of these characteristics that the cell resistance will follow upon application of sense current and word line current based fields having been determined by the direction of orientation of the last external field applied to the cell sufficiently large to switch the magnetizations of both cell ferromagnetic thin-film layers in the presence of the chosen sense current. A limited externally applied field (the limitations imposed by limiting the corresponding word line current and possibly the sense current) in the presence of the sense current chosen is initially provided having a value capable of placing the resistance of the cell at one of its peak values in either one or the other of characteristics 30 and 31, and the cell or storage line structure voltage measuring circuitry is concurrently "autozeroed" to thereby measure a zero value in these circumstances. This initial field is limited in magnitude so as to be unable to switch the direction of magnetization of thicker layer 12, 13 in the presence of the chosen sense current magnitude.

To complete retrieving the stored cell information, the limited externally applied field is then reversed from its initial direction to a final limited value in the opposite direction that is capable of placing the resistance of the cell at its other characteristic resistance peak, but not capable of switching the direction of magnetization of thicker layer 12, 13 in the presence of the chosen sense current magnitude. If the cell resistance is actually at a resistance peak initially in following one of characteristics 30 or 31 because of the direction of the last previously applied word line current based field of a magnitude sufficient to switch magnetizations of both ferromagnetic layers, the resistance after the field reversal will decrease as the magnetization of the thinner layer switches to be oriented in the same direction as the direction of magnetization of the thicker layer. If the cell resistance is instead following the other characteristic so that it exhibits a relatively low resistance initially, the resistance after the field reversal will increase as the magnetization of the thinner layer switches to be oriented in the direction opposite to direction of the magnetization of the thicker layer.

Thus, the resistance change on the reversal from a field oriented in one direction of a magnitude limited to be at a resistance characteristic peak to a limited field oriented in the opposite direction will indicate which of the characteristics 30 and 31 the cell followed, and so in what direction the last sufficiently large externally applied magnetic field was oriented to thereby indicate the binary value of the data bit represented thereby. The change in the resistance value, ΔR, is equal to the fill change in resistance between the peak resistance value, representing the ferromagnetic layers magnetizations being opposed in direction to one another, to the relatively low resistance value representing the layer magnetizations being oriented in the same direction as one another. This retrieval process provides a bipolar output indication since an increase of this magnitude indicates one stored data bit value and a decrease indicates the opposite stored data bit value. Thus, the difference between the magnetic state indication represented by an increase in resistance, +ΔR, and the magnetic state indication represented by a decrease in resistance, −ΔR, is +ΔR−(−ΔR)=2ΔR, or twice the resistance change value to give the voltage measuring circuitry across the storage line structure a readily detectable state differentiating output signal to measure from its "autozeroed" initial measuring point.

The above process for storing and retrieving data bits from memory cells just described can have the requirement therein for changing magnitudes of word line currents or sense currents, or both, alleviated by the addition of further structures to the memory. One alternative arrangement is to provide a further conductor over each storage line structure shown in FIGS. 1A and 1B but separated therefrom by an insulating layer, and also separated from the word lines thereabove. Such a conductor can have a current therein that will result in a biasing magnetic field being provided in the same direction perpendicular to the easy axis in each ferromagnetic layer in each memory cell in the corresponding storage line structure. This differs from the field established in those ferromagnetic layers by a sense current provided in the storage line structure through the memory cell leading to this sense current based field being oriented perpendicular to the easy axis but in opposite directions in each of the ferromagnetic layers in the memory cell. This occurs because that current flows substantially symmetrically above and below the vertical geometric center of that cell to create a magnetic field encircling it that is oriented in opposite directions above and below it. In this arrangement, cells could be selected for storing a data bit by coincident currents flowing in the cell word line and the cell bias line to select the cell where they crossed without having to rely during operation on the sense current or changing the word line current value for the next operation depending on whether a data bit storage or retrieval operation was to be undertaken.

Another alternative arrangement is to provide a meander word line for each storage line structure in the memory of FIGS. 1A and 1B such that the meander line, positioned above but separated from the word lines below by an insulating layer, parallels each word line crossing over that storage line structure. In such an arrangement, the meander line would start on one side of a memory cell below and cross over that cell to the other side thereof by paralleling the word line also crossing that cell. Once the meander line is so positioned crossing over the cell, rather than following the word line also therebelow any farther, the meander line would then have a right angle turn therein to thereby parallel the direction of extent of the storage line structure until the adjacent word line. Another right angle turn in the meander line would lead to the meander line paralleling this adjacent word line to cross over the adjacent memory cell in the storage line structure. Repeating this pattern leads to the meander line following the shape of approximately a square wave centered on the storage line axis of extent. Choosing the direction of current flow through the meander line appropriately would allow the generation of a meander field to aid the word lines fields. Again, coincident currents in a word line and the meander line would allow selecting the cell where they crossed without having to rely during operation on the sense current or changing the word line current value for the next operation depending on whether a data bit storage or retrieval operation was to be undertaken.

Characteristics 30 and 31 of FIG. 3, although typical, can and, as cells 17 decrease in size, do tend to have the peak portions thereof overlap more than is shown in FIG. 3. In the absence of externally applied fields, the degree to which the magnetizations in the ferromagnetic thin-film layers in a memory cell 17 are oriented in the same or opposite directions is determined by the values of the angles between the directions of magnetization in each layer and the easy axis of that layer that lead to the lowest free energy balance between the layer anisotropy energies, the layers exchange coupling energy and correlated surface waviness or textural variation coupling energy ("orange-peel coupling"), and energies of the interactions between the layer demagnetization fields and the layer magnetizations. While, as indicated above, the demagnetization energies can be significantly controlled by the cell geometry, the exchange energy is more variable. Although the exchange energy is very dependent on the separation of the two ferromagnetic layers in a memory cell 17, i.e. the thickness of the non-magnetic intermediate layer, this energy is also quite dependent on the nature of the surfaces between these ferromagnetic layers and the intermediate layer that result from the fabrication process.

Figure 4A:
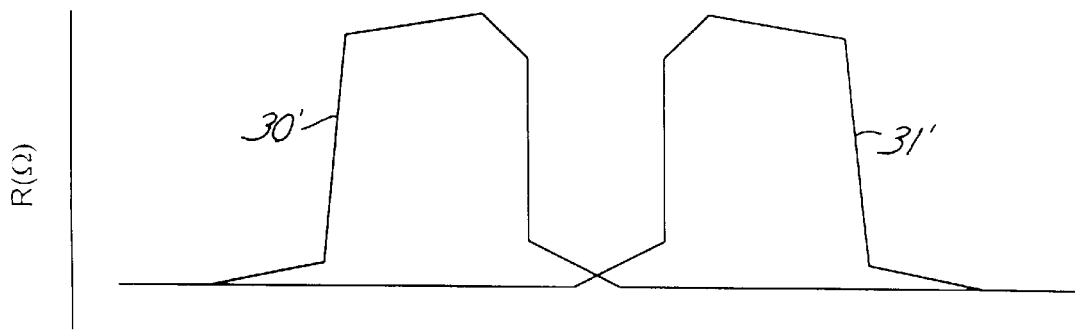
Figure 4B:
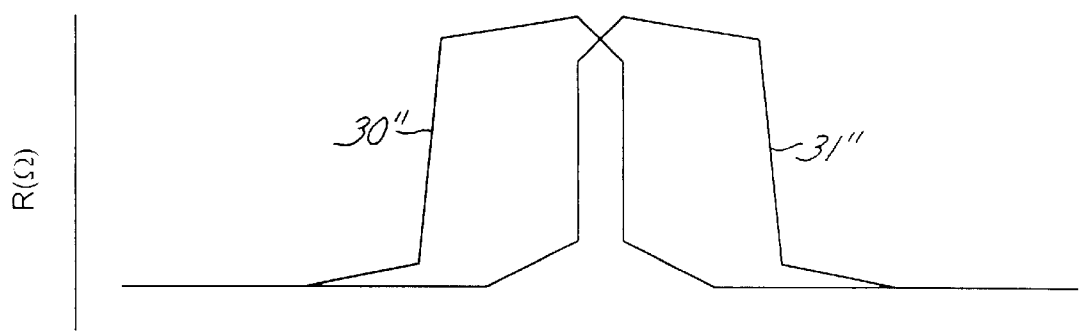

In FIG. 4A, a somewhat idealized representation is shown of magnetoresistance versus applied external field characteristics (with just enough sense current to permit measurement of these characteristics) for a memory cell 17 in which the exchange and surface textural variation coupling substantially prevails thereby tending to force the magnetizations in each layer toward pointing in the same direction. This situation leads to little or no overlap of the resistance peaks of each characteristic here designated 30' and 31'. In the characteristics, 30" and 31", shown in FIG. 4B, however, the demagnetization energies substantially prevail for the memory cell 17 represented leading to a significant overlap of the resistance peaks. As indicated above, the characteristics represented in FIG. 4B are the outcome of reducing the geometrical extent of bit structures or memory cells 17, and this occurs because of the increasing demagnetization fields resulting from magnetic material structures of smaller sizes (primarily due to shortened lengths). The above described data bit storage and retrieval processes operate satisfactorily in either circumstance shown in FIGS. 4A and 4B, as well as in the intermediate situation shown in FIG. 3.

Magnetic structures are known, from thermodynamic considerations, to have stable equilibrium states of magnetization at minimums of the free energies of those structures. The total free energy of a bit structure or memory cell 17 can be given generally as $$E_{Tot}=E_1+E_2+E_{12},$$

where the total free energy is represented by $E_{Tot}$, the self-energy of the first and second layers being represented by $E_1$ and $E_2$, respectively, and with the interaction energy between the two layers represented by $E_{12}$. As indicated above, a reasonable approximation for the structure of a bit structure 17 is to assume that the ferromagnetic thin-film layers therein are each of a single domain allowing the assumption that the magnetization of a layer changes only by rotation, and that these layers exhibit uniaxial anisotropy. These and further other reasonable approximations, such as assuming there is no magnetic energy at present due to magnetostriction or to other causes, allows an analytic representation of the behavior of a bit structure or memory cell 17 that rather closely matches the characteristics shown in FIGS. 3 and 4. The expressions provided for this purpose representing these energies will be based on the bit structure shown in FIG. 5A as taken from bit structures 17 shown in FIG. 1A.

The self-energy for this purpose of thicker ferromagnetic thin-film composite layer 12, 13, designated here as the first layer, can be represented as $$E_1 = \frac{H_{k1} M_{s1} V_1}{2} \sin^2(\theta_1) + \frac{D_{1L} M_{s1}^2 V_1}{2} \sin^2(\theta_1) + \frac{D_{1W} M_{s1}^2 V_1}{2} \cos^2(\theta_1) + H_w M_{s1} V_1 \cos(\theta_1) - (S_1 H_s - H_b) M_{s1} V_1 \sin(\theta_1),$$

and the self-energy of thinner ferromagnetic thin-film composite layer 13', 12' considered the second layer can be similarly written as $$E_2 = \frac{H_{k2} M_{s2} V_2}{2} \sin^2(\theta_2) + \frac{D_{2L} M_{s2}^2 V_2}{2} \sin^2(\theta_2) + \frac{D_{2W} M_{s2}^2 V_2}{2} \cos^2(\theta_2) + H_w M_{s2} V_2 \cos(\theta_2) - (S_2 H_s + H_b) M_{s2} V_2 \sin(\theta_2).$$

The first term in each of these self-energy expressions represents the anisotropy energy in the corresponding one of the layers due to the anisotropies present therein, primarily the anisotropy brought about by the deposition of these ferromagnetic films in the presence of a magnetic field leading to requiring energy to deviate the magnetization of the film from the easy axis therein established by such deposition. The effects of such anisotropies are cumulatively represented in a well known manner by an effective anisotropy field in each layer, $H_{k1}$, and $H_{k2}$, respectively, multiplied by the saturation magnetization of that layer which is $M_{s1}$ for layer 1 and is $M_{s2}$ for layer 2. The angle between the magnetization of the first layer, $M_1$, shown by a dashed line vector in FIG. 5A, and its easy axis is represented by $\theta_1$. The angle between the magnetization of the second layer, $M_2$, shown by a solid line vector in that figure, and its easy axis is represented by $\theta_2$. The volume of each layer, $V_1$ for layer 1 and $V_2$ for layer 2, multiply the respective terms to give the total anisotropy energy in each corresponding layer.

The second and third terms in each of the last two energy expressions represent the demagnetization self-energy for each of the corresponding layers in a form typically written therefor. In these terms, the symbols $D_{1L}$ and $D_{2L}$ each represent the demagnetization factor corresponding to the length axis for the pertinent one of the first and second ferromagnetic thin-film layers in bit structure 17. The symbols $D_{1W}$ and $D_{2W}$ in these terms each represent the demagnetization factors corresponding to the width axis for the related layer.

Figure 5A:
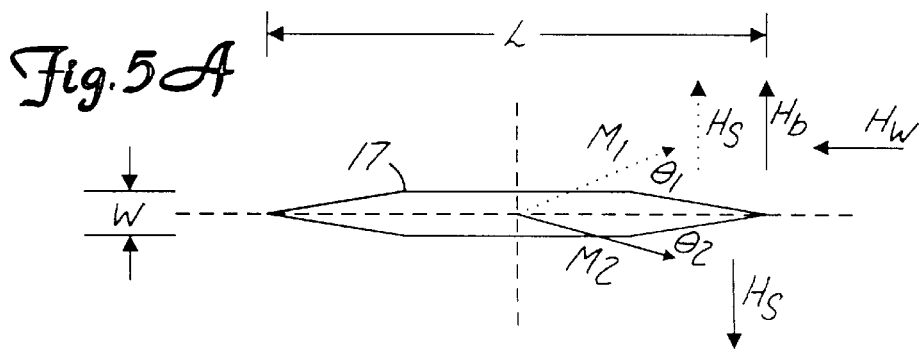

The fourth terms of each of these expressions represent the energy of the magnetization in the corresponding layer due to the current applied in the associated word line 22 to generate a magnetic field, $H_w$, shown directed from right to left in FIG. 5A. Should a meander word line as described above be used, the field contribution from current in that line would be merely added to, and part of, the field $H_w$ supplied by the current through word line 22 over the corresponding bit structure 17.

The last term in each of these expressions represents the energy of the magnetization in the corresponding layer due to the applied sense current flowing from end to end through bit structure 17 as part of a storage line structure to generate a field, $H_s$. In FIG. 5A, that field is shown by a dashed line arrow pointing upward for layer 1 of the bit structure 17 shown there, and by a solid arrow pointing downward for layer 2 in that structure assuming a current flow through the structure from left to right. A symmetry factor for each layer, $S_1$ and $S_2$, multiplies the sense field $H_s$ to account for the asymmetry in the situation of each of the layers 1 and 2 resulting from their different structures and locations in the bit structure. A further term is provided for a field generated by the use of a bias line over the storage line structure carrying a current as described above, this field being designated by $H_b$ and represented in FIG. 5A by an upward pointing solid line arrow assuming current flow in that bias line is from left to right should such a bias line be used.

The interaction energy between the two ferromagnetic thin-film layers in a bit structure or memory cell 17 is given by $$E_{12} = -H_e V_{avg} M_{s-avg} \cos(\theta_1 + \theta_2) - \frac{V_1 D_{2W} + V_2 D_{1W}}{2} M_{s1} M_{s2} \sin(\theta_1) \sin(\theta_2) + \frac{V_1 D_{2L} + V_2 D_{1L}}{2} M_{s1} M_{s2} \cos(\theta_1) \cos(\theta_2).$$

The first term in this interaction energy expression accounts for the exchange coupling energy and the correlated surface waviness (textural variation) coupling energy which is represented by an effective exchange field, $H_e$, in the usual manner to cover these couplings between the ferromagnetic thin-film layers. This term is multiplied by the average volume and magnetization of both of these layers, or $$V_{avg} = \frac{V_1 + V_2}{2}$$

and $$M_{s-avg} = \frac{M_{s1} T_1 + M_{s2} T_2}{T_1 + T_2}.$$

The last two terms in the ferromagnetic layer interaction energy expression represent the effects of the magnetization in one layer upon the magnetization in the other analogous to the well known dipole-dipole interaction through considering the magnetization in each layer as a dipole interacting with the magnetization in the other. Because of the extremely close proximity of the two ferromagnetic layers, the effective field in one layer due to the demagnetization field in the other is taken to be identical to that source demagnetization field, ignoring any effects of the separation. These terms are responsible for the switching inhibition described above (and some rotation aiding) leading to the elevated magnitude threshold faced in switching the direction of magnetization of thicker ferromagnetic layer 12, 13 when the magnetization of thinner layer 13', 12' is directed oppositely to that of the thicker layer.

Figure 5B:
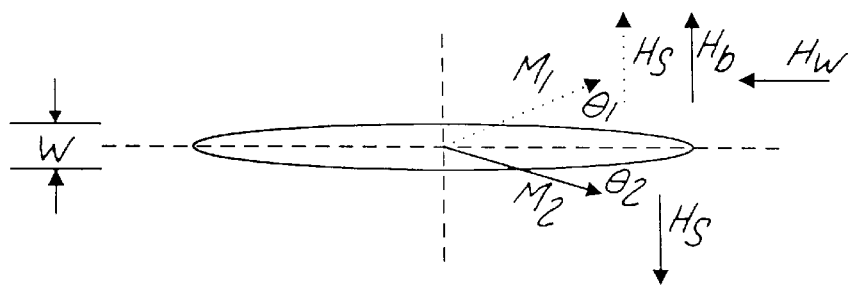

Ferromagnetic material masses of general shapes in a magnetic field lead to very complex demagnetization factors characterizing the internal response of that mass to the field. Homogeneous bodies having surfaces characterizable by expressions in the second degree lead to demagnetization factors in uniform fields which are much more tractable, i.e. the magnetization factors for ellipsoids have been determined in analytical closed form. As can be seen in FIG. 5B, an ellipsoid can be provided with corresponding ones of its axes numerically equal to the length, width and thickness of the ferromagnetic thin-film layers in bit structure 17 of FIG. 5A. The resulting ellipsoid can be seen to rather closely approximate those layers in viewing FIGS. 5A and 5B together, at least for thinner composite ferromagnetic layer 13', 12' exposed in FIG. 5A. However, the length and width of thicker ferromagnetic composite thin-film layer 12, 13 is the same as that of layer 13', 12' and the thickness differences between the two layers are easily accounted for by the different dimensions of the third axis of the ellipsoids used to represent them to reflect the difference between the thicknesses of those layers. The resulting demagnetization factors are $$D_{1L} = \frac{4\pi\cos(\phi)\cos(\zeta_1)}{\sin^3(\zeta_1)\sin^2(\alpha_1)}[F(k_1,\zeta_1) - E(k_1,\zeta_1)]$$

and $$D_{2L} = \frac{4\pi\cos(\phi)\cos(\zeta_2)}{\sin^3(\zeta_2)\sin^2(\alpha_2)}[F(k_2,\zeta_2) - E(k_2,\zeta_2)]$$

for the demagnetization factors corresponding to the lengths of the ellipsoids representing the two ferromagnetic thin-film layers of memory cell 17 in FIG. 5A, and $$D_{1W} = \frac{4\pi\cos(\phi)\cos(\zeta_1)}{\sin^3(\zeta_1)\sin^2(\alpha_1)\cos^2(\alpha_1)} \times$$

$$\left[E(k_1,\zeta_1) - \cos^2(\alpha_1)F(k_1,\zeta_1) - \frac{\sin^2(\alpha_1)\sin(\zeta_1)\cos(\zeta_1)}{\cos(\phi)}\right]$$

and $$D_{2W} = \frac{4\pi\cos(\phi)\cos(\zeta_2)}{\sin^3(\zeta_2)\sin^2(\alpha_2)\cos^2(\alpha_2)} \times$$

$$\left[E(k_2,\zeta_2) - \cos^2(\alpha_2)F(k_2,\zeta_2) - \frac{\sin^2(\alpha_2)\sin(\zeta_2)\cos(\zeta_2)}{\cos(\phi)}\right]$$

for the demagnetization factors corresponding to the widths of these ellipsoids for these layers.

In these equations for the demagnetization factors, the various trigonometric terms, $\cos(\Phi)$, $\cos(\zeta_x)$, and $\sin(\alpha_x)$, are defined as $$\cos(\phi) = \frac{W}{L}\left(0 \leq \phi \leq \frac{\pi}{2}\right),$$

$$\cos(\zeta_X) = \frac{T_X}{L}\left(0 \leq \zeta_X \leq \frac{\pi}{2}\right),$$

and $$\sin(\alpha_x) = \left[\frac{1-\left(\frac{W}{L}\right)^2}{1-\left(\frac{T_x}{L}\right)^2}\right]^{\frac{1}{2}} = \frac{\sin(\phi)}{\sin(\zeta_x)} = k_x\left(0 \leq \alpha_x \leq \frac{\pi}{2}\right),$$

where L is the length of the ellipsoid, W is the width of the ellipsoid, and $T_x$, represents the thicknesses of either of the two approximating ellipsoids through x being set to either 1 or 2 to indicate the first or second layer. The functions denoted by $F(k_x, \zeta_x)$ and $E(k_x, \zeta_x)$ are elliptic integrals of the first kind and the second kind, respectively, defined as $$F(k_x, \zeta_x) = \int_0^{\zeta_x} \frac{1}{\sqrt{1-k_x^2\sin^2(\psi)}} d\psi$$

and $$E(k_x, \zeta_x) = \int_0^{\zeta_x} \sqrt{1-k_x^2\sin^2(\psi)} \, d\psi.$$

These expressions for the demagnetization factors can be further simplified in several situations, including the present situation where the length and width are of comparable magnitudes but each are more than an order of magnitude greater than the thickness, i.e.

$$L \geq W \gg T_x.$$

In this circumstance, the demagnetization factors can be expressed as $$D_{1L} \approx 4\pi T_1 \frac{(1-e^2)^{\frac{1}{2}}}{L} \frac{K-E_c}{e^2} = 4\pi T_1 F_L$$

and $$D_{2L} \approx 4\pi T_2 \frac{(1-e^2)^{\frac{1}{2}}}{L} \frac{K-E_c}{e^2} = 4\pi T_2 F_L$$

for the demagnetization factors corresponding to the lengths of the ellipsoids representing the corresponding one of the two ferromagnetic layers, and $$D_{1W} \approx 4\pi T_1 \frac{E_c - (1-e^2)K}{Le^2(1-e^2)^{\frac{1}{2}}} = 4\pi T_1 F_W$$

and $$D_{2W} \approx 4\pi T_2 \frac{E_c - (1-e^2)K}{Le^2(1-e^2)^{\frac{1}{2}}} = 4\pi T_2 F_W$$

for the demagnetization factors corresponding to the widths of these ellipsoids representing those layers. In these last equations for the demagnetization factors, the symbol e is defined as $$e = \left(1 - \frac{W^2}{L^2}\right)^{\frac{1}{2}}.$$

The functions K and $E_c$ are complete elliptic integrals given as $$K = \int_0^{\frac{\pi}{2}} \frac{1}{\sqrt{1-e^2\sin^2(\psi)}} d\psi$$

and $$E_c = \int_0^{\frac{\pi}{2}} \sqrt{1-e^2\sin^2(\psi)} \, d\psi.$$

Using these last expressions for the demagnetization factors, the above expressions for the energy components in the free energy of the bit structures 17 of FIG. 5A can be rewritten in simplified form. The self-energy of ferromagnetic thin-film layer 12, 13 becomes $$E_1 = \frac{H_{k1} M_{s1} V_1}{2}\sin^2(\theta_1) + \frac{4\pi T_1 F_L M_{s1}^2 V_1}{2}\sin^2(\theta_1) + \frac{4\pi T_1 F_W M_{s1}^2 V_1}{2}\cos^2(\theta_1) +$$

$$H_w M_{s1} V_1 \cos(\theta_1) - (S_1 H_s - H_b) M_{s1} V_1 \sin(\theta_1).$$

The expression for the self-energy of layer 13', 12' now is $$E_2 = \frac{H_{k2} M_{s2} V_2}{2}\sin^2(\theta_2) + \frac{4\pi T_2 F_L M_{s2}^2 V_2}{2}\sin^2(\theta_2) + \frac{4\pi T_2 F_W M_{s2}^2 V_2}{2}\cos^2(\theta_2) +$$

$$H_w M_{s2} V_2 \cos(\theta_2) - (S_2 H_s + H_b) M_{s2} V_2 \sin(\theta_2).$$

Finally, the interaction energy expression becomes $$E_{12} = -H_e V_{avg} M_{s-avg} \cos(\theta_1 + \theta_2) -$$
$$\frac{V_1 4\pi T_2 F_W + V_2 4\pi T_1 F_W}{2} M_{s1} M_{s2} \sin(\theta_1)\sin(\theta_2) +$$
$$\frac{V_1 4\pi T_2 F_L + V_2 4\pi T_1 F_L}{2} M_{s1} M_{s2} \cos(\theta_1)\cos(\theta_2)$$

or $$_{12} = -H_e V_{avg} M_{s-avg} \cos(\theta_1 + \theta_2) -$$
$$\frac{V_1 T_2 + V_2 T_1}{2} 4\pi F_W M_{s1} M_{s2} \sin(\theta_1)\sin(\theta_2) +$$
$$\frac{V_1 T_2 + V_2 T_1}{2} 4\pi F_L M_{s1} M_{s2} \cos(\theta_1)\cos(\theta_2).$$

In the absence of any applied fields, including any applied word line fields or fields due to a sense current or a bias current, the last energy equations can be rewritten to represent the internal energy situation of the bit structure, or $$E_{Tot-int} = E_{1-int} + E_{2-int} + E_{12}$$

where the "int" in subscripts means internal and its omission in the last term means that the interaction energy is unchanged in the absence of externally applied fields. These equations can then be minimized to find the angles at which the magnetizations and the two layers lie with respect to each other to result in balancing the anisotropy energies of the layers, the self-energies of the layers and the interaction energy between the layers. The result determines the amount of overlap of the two resistance characteristics of the bit structure at the zero word line field point, there having been two examples of different overlaps in the resistance characteristics as shown in FIGS. 4A and 4B. These equations, as rewritten for this purpose and assuming a very small sense current being used just sufficient to allow measurement without a significant impact on the fields, are $$E_{1-int} =$$
$$\frac{H_{k1} M_{s1} V_1}{2}\sin^2(\theta_1) + \frac{4\pi T_1 F_L M_{s1}^2 V_1}{2}\sin^2(\theta_1) + \frac{4\pi T_1 F_W M_{s1}^2 V_1}{2}\cos^2(\theta_1)$$

and $$E_{2-int} =$$

-continued
$$\frac{H_{k2} M_{s2} V_2}{2}\sin^2(\theta_2) + \frac{4\pi T_2 F_L M_{s2}^2 V_2}{2}\sin^2(\theta_2) + \frac{4\pi T_2 F_W M_{s2}^2 V_2}{2}\cos^2(\theta_2).$$

The equation for the interaction energy given previously is used with these last two equations to together represent the total internal energy $E_{Tot-int}$.

Some limitations must be satisfied by bit structures 17 to have them behave during digital data storage and retrieval operations as desired. The width dimension W thereof is subject to at least two conditions which limit its extent to being less than certain values. As indicated above in describing the operating process, the switching of the directions of the magnetizations of the layers at certain threshold values of the word line current based fields depends on the magnitude of the sense fields due to the sense current since these sense fields affect those thresholds. The ability of the fields generated by the sense currents to affect the thresholds will be diminished and eventually disappear (or become negligibly small) as the width dimension of bit structure 17 become increasingly wide. This begins to occur when the width of the bit structure exceeds twice the curling length experienced in that structure for the magnitude of the word line current based field used for switching the directions of the layer magnetizations.

The magnetizations of portions near the sides of a bit structure 17 are pinned there in a direction parallel to the sides to a greater extent than those in the interior of the structure because of demagnetization considerations. Thus, as the structure widens, the applied field will at some point switch the magnetization of the layers in the interior central portions thereof without having switched the magnetizations of the layer portions near the edges thereof. As a result, the fields due to the sense current, which are orthogonal in direction to those induced by the word line currents, tend to interact with the magnetizations of the ferromagnetic layers in two counteracting ways rather than in one supporting way. That is, the fields due to the sense current will cause torques on the magnetizations already rotated in the central interior portions in one direction, but cause torques on the magnetizations at the edges in an opposite direction to thereby in effect cancel out the torques on the magnetizations. The intent is instead to have the torques generated by the sense current fields act in a common direction to aid the switching of the magnetizations under the applied word line current fields. Hence, the width of bit structure 17 should be no greater than twice such curling lengths occurring therein from its sides inward. If the width of a bit structure 17 is less than twice the curling length's characteristic thereof, the magnetizations of the layers, both in the central interior portions and near the outer side portions thereof, rotate together and so are subject to torques from the field generated by the sense current in a common direction.

On the other hand, the sense current can be kept sufficiently small so as not to be a significant factor in determining the magnetization direction switching thresholds, particularly when a meander word line as described above is used. In any event, suitable operation of bit structure 17 as described above requires that demagnetizing fields be of sufficient magnitude to serve to inhibit the switching of the thicker ferromagnetic thin-film layer magnetization once the magnetization of the thinner layer has already been oppositely directed as described above. This inhibition is due primarily to the demagnetizing field components that parallel the width dimension of bit structure 17 since these demagnetizing fields will be considerably greater in magnitude than those along the length of that structure given that the width has significantly smaller extent than does the length. To assure that the demagnetizing fields associated with the width are dominant with respect to the anisotropy fields occurring in the layers, a bit structure 17 is required to have a width sufficiently small to result in the width component demagnetization field being larger than the anisotropy field for the layer, or that $H_{dx}$, representing the demagnetization field along the widths, be greater than $H_{kx}$ leading to $$H_{dx}=D_{xW}M_{sx} \approx 4\pi T_x F_W M_{sx} > H_{kx}$$

This inequality then yields $$F_W > \frac{H_{kx}}{4\pi T_x M_{sx}},$$

or $$\frac{E_c - (1-e^2)K}{Le^2(1-e^2)^{\frac{1}{2}}} > \frac{H_{kx}}{4\pi T_X M_{SX}}.$$

Since K and $E_c$ do not vary much in value with decreasing values of e, the ratio of the width to the length must be kept sufficiently small such that the $(1-e^2)^{1/2}$ factor in the denominator on the left side of the inequality is small enough to make the inequality hold for the choice of thickness of the corresponding ferromagnetic layer material chosen, this material having a particular anisotropy field $H_{kx}$ and a particular saturation magnetization $M_{sx}$.

Aside from its effect on the ratio of width to length in the last equality, there are no significant further limitations on the length of a bit structure 17 beyond practicality limitations. One such limitation is that the need to provide a fairly uniform word line current based magnetic field across a bit structure 17 requires that the word line be approximately as wide as that bit structure. For a desired magnitude of the field generated by the word line current, that current necessary to provide that field magnitude becomes proportional to the width of the word line, that is, equivalently, to the length of the bit structure 17. Thus, there is not only a desire to keep the bit length short to allow as many as possible to be provided in the digital memory to improve its density of storage, there is also a desire to keep the word line currents as small as possible to reduce the heat dissipation in the monolithic integrated circuit which also, as just indicated, requires keeping the bit structure lengths relatively short.

A further limitation which is related to both the length and the width of a bit structure 17 comes about in connection with the overlap of bit juncture 20 over the ends of those adjacent bit structures 17 interconnected thereby. If the electrically conductive metal of a bit juncture 20 extends too far along the length of a bit structure 17 in interconnecting it into the storage line structure, a magnetic domain wall can occur in the ferromagnetic layers under the overlap area to thereby result in that bit structure having one or both ferromagnetic layers in a multiple magnetic domain state rather than a single domain state thereby leading to erratic switching threshold behavior. In layers formed of typical ferromagnetic thin-film materials with typical parameters, such "pseudo" Néel ferromagnetic layer walls in these layers are typically 0.1 to 0.3 μm wide, and are tilted at an approximately 45° angle. Thus, the overlap region along the length of the bit structure should be less than the width of that bit structure plus two such wall widths. In a 0.4 μm wide bit structure with ferromagnetic thin-film layers 60 Å thick, the overlap region would then be required to be less than 1.0 μm.

A final limitation on bit structure 17 is related to the required difference in thicknesses between thicker composite ferromagnetic thin-film layer 12, 13 and thinner layer 13', 12'. An insufficient difference in thickness between these two layers in the face of high rate of applied magnetic field changes, such as results from the use of an abrupt change in current in the word lines to generate such field changes, can lead to switching the direction of magnetization in both layers concurrently even though just one of them was intended to be switched. That is, if the difference in thickness between the layers, and so the difference in magnetization therebetween, is not sufficiently large, the direction of magnetization in each of these layers will switch together even if the magnitude intended for the switching field is only slightly larger than the switching threshold value of the thinner layer should the change in that field be applied at a high enough rate. Such high rates of application will result from the typical changes in word line current values resulting from transistor switches being switched off and on which often result in the current change approximating a step function.

Since the behavior of the magnetization in the ferromagnetic layers of a bit structure in response to a sharply changing magnetic field is of present concern, the equations of motion for the magnetizations in the ferromagnetic layers in response to changes in magnetic fields are pertinent. Suitable equations of motion are found to relate the time rate of change of the magnetization to the torque applied to that magnetization by all of the magnetic fields present plus some damping of that motion. A well known equation expressing this relationship, based on choosing a certain form of such damping, is the Gilbert equation or $$\frac{d}{dt}\vec{M} = \gamma\left(\vec{M} \times \vec{H}\right) - \frac{\alpha}{M_s}\left(\vec{M} \times \frac{d}{dt}\vec{M}\right).$$

Here, the magnetization is shown as a vector, $\vec{M}$, as is the total magnetic field applied to the magnetization, $\vec{H}$. The symbol γ is the gyromagnetic ratio, and the symbol α is the damping constant which will be quite small, typically 0.02.

Expressing this vector equation in its components represented in spherical coordinates results in the following coupled system of first order differential equations (for thin-films with magnetizations constrained by vertical demagnetizing fields to essentially lie in the plane of the film).

$$\frac{d}{dt}\theta = -\frac{4\pi M_s |\gamma|}{1+\alpha^2}\phi + \frac{|\gamma|\alpha}{M_s(1+\alpha^2)}\tau,$$

and $$\frac{d}{dt}\phi = -\frac{4\pi M_s \alpha |\gamma|}{1+\alpha^2}\phi - \frac{|\gamma|}{M_s(1+\alpha^2)}\tau.$$

Here, θ is the azimuthal angle (or ferromagnetic layer in-plane angle) and φ is the polar angle (or ferromagnetic layer out of plane angle) in spherical coordinates. The symbol τ represents the torque effectively applied as a result of the magnetic fields present.

Figure 6:
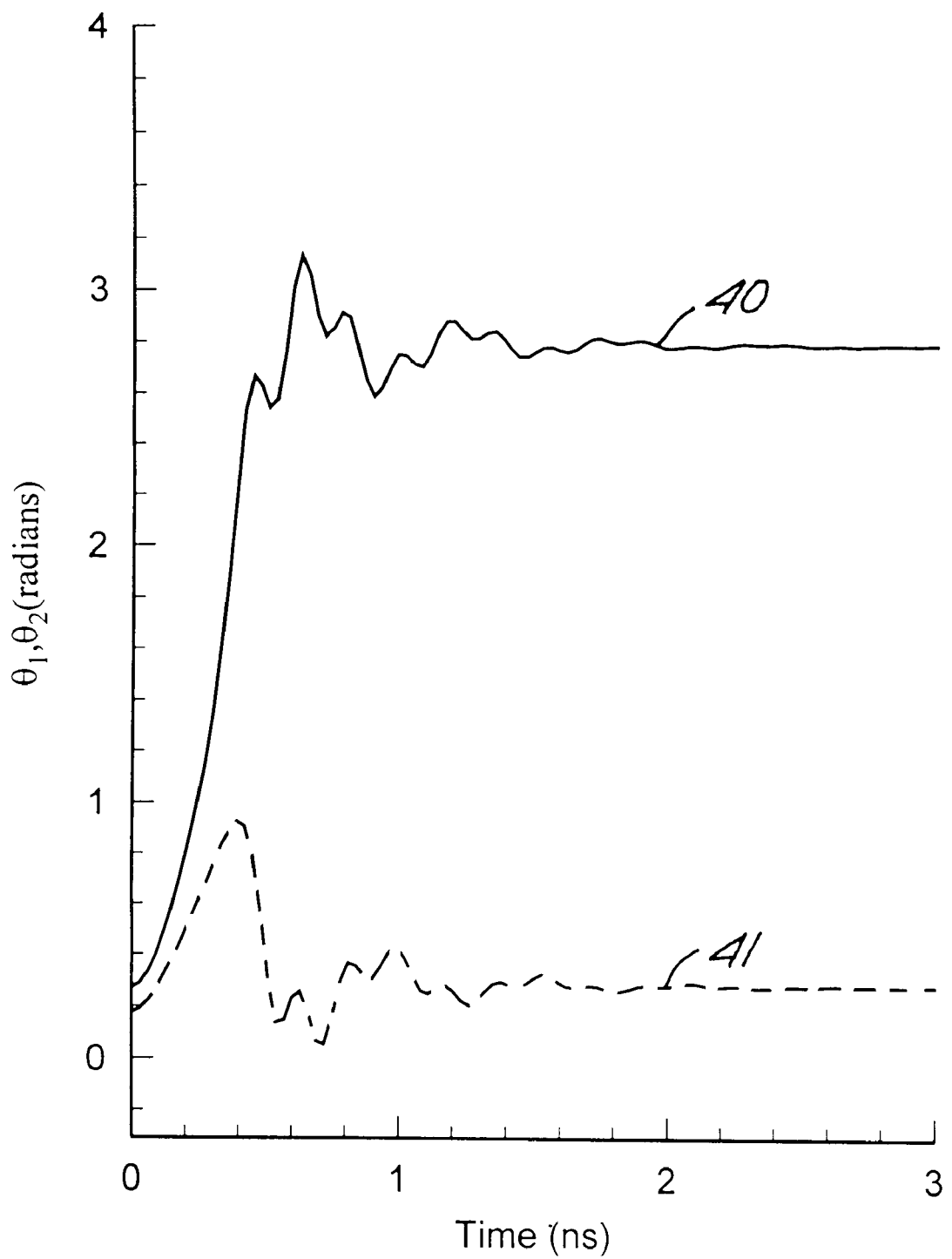
FIG. 6 represents a graph of responses for a structure similar to one of those shown in FIGS. 1A, 1B and 2, FIGS. 7A and 7B show graphs of characteristics for a structure similar to one of those shown in FIGS. 1A, 1B and 2.

The response of the magnetizations of the thinner and thicker ferromagnetic thin-films in a bit structure 17 to the dynamic application of torques via the magnetic fields generated by the associated word line currents can be found from these latter equations. FIG. 6 shows a graph of the rotational angular responses of the magnetizations to a word line current generated torque shifting abruptly from zero to a value of about 30 Oe. The lower coercivity thinner layer 13', 12' is represented by an upper plot, 40, on that graph showing how it is more responsive to the applied torque than is the higher coercivity, thicker layer 12, 13 represented by the lower plot designated 41. This upper plot is shown with the thinner layer magnetization having rotated in response to an angle from the easy axis of about $\pi$ radians, and so this plot reflects that the direction of the magnetization is switched in that layer due to the application of the word line current generated field.

Notice that there is a substantial oscillation in the angular position of this magnetization vector in reaching its final angular value as seen in plot 40. Although this oscillation, or "ringing", in the response of the magnetization of the thinner ferromagnetic layer to the step function in the word line field is relatively inconsequential to the operation of the device, a similar "ringing" occurs in the rotational angular behavior of the magnetization vector of the thicker layer as seen in plot 41 which can be of much more significance. The largest peak in the "ringing" portion of the lower plot reaches an angular value that is more than twice the angular value of the final angular position taken by the thicker layer magnetization as a result of the applied step function word line current change and the aiding effect of the magnetization angular position change in the thinner layer (up to the point of switching the magnetization direction in that layer).

Although not a problem for the bit structure represented in FIG. 6 because the switching of the magnetization direction in the thinner layer immediately thereafter begins to inhibit the angular positional change of the magnetization of the thicker layer before it reaches $\pi/2$ radians, in some bit structures having too small a difference between the thicknesses of the ferromagnetic thin films or too small a sense current, or both, this initial peak in the "ringing" could reach the $\pi/2$ radian value. At that point, the thicker ferromagnetic layer switches the direction of its magnetization more or less concurrently with the switch in the direction of the magnetization of the thinner layer even though the ultimate final value intended for the angle of rotation of the magnetization of the thicker layer in response to the step function word line current change was less than $\pi/2$ radians. That is, a word line current step function could be applied with the intention of switching the direction of magnetization of the thinner ferromagnetic layer but not that of the thicker layer, but nevertheless result in switching the directions of magnetizations of both layers because of the peak in the "ringing" portion of the response of the magnetization of the thicker layer to the applied field.

Figure 7B:
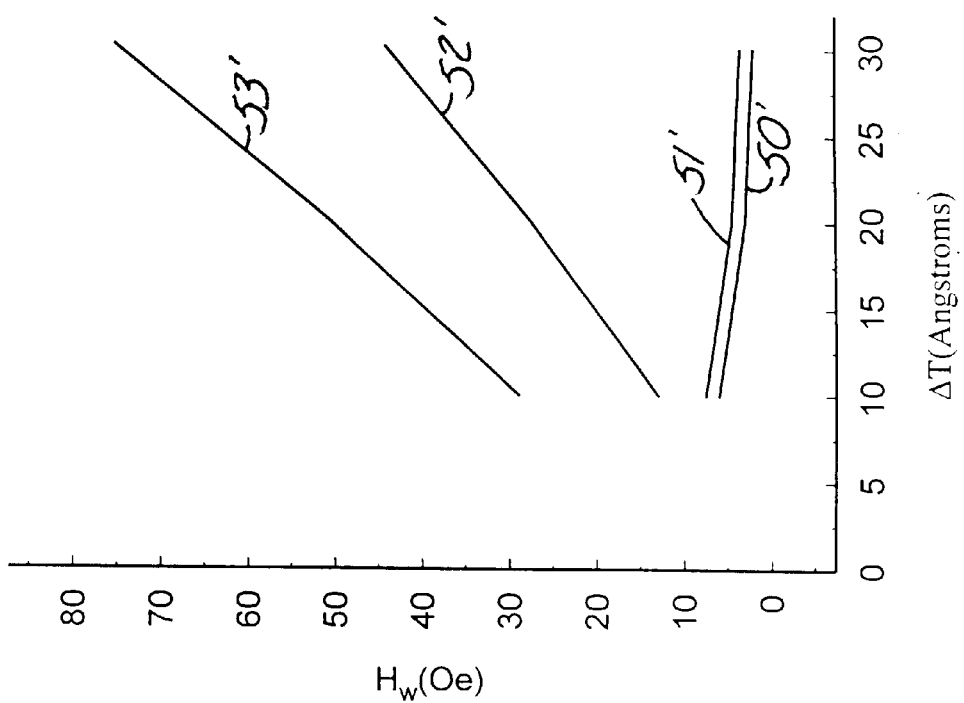
Figure 7A:
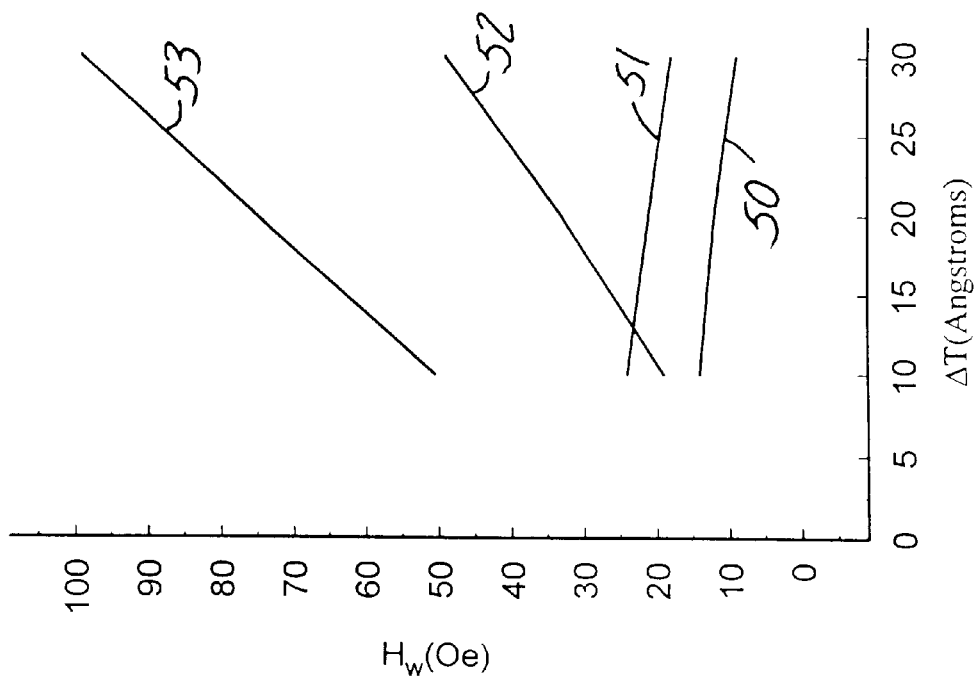

The implications of this dynamic behavior of the rotating magnetizations of the thinner or thicker ferromagnetic thin-films in bit structure 17 can be seen in FIGS. 7A and 7B. In these figures, the dynamic thresholds are plotted as opposed to the quasi-static thresholds which result from minimizing the foregoing energy equations without regard to the dynamic behavior of the structure during operation. The quasi-static thresholds would be from 10% to 15% greater than the dynamic switching thresholds shown in FIGS. 7A and 7B. These switching thresholds are all found on the basis of using the highest rate of change in the effectively applied torque, that is, they are the thresholds which result from a step-function change in the word line current. A sense current is provided resulting in a sense field of 15 Oe.

The lowest threshold, 50, represents the switching threshold for thinner layer 13', 12' when both the magnetization thereof, and of the thicker layer, have not yet been switched to a direction that is the same as the direction of the applied word line field. The next greater switching threshold, 51, is also for the thinner ferromagnetic thin-film layer, but with the thicker layer having its direction of magnetization matching that of the applied word line field. As can be seen, the magnetization of the thicker layer in this instance has inhibited the rotation of the magnetization of the thinner layer to effectively raise the switching threshold for that thinner layer. In each instance, the thinner layer switching threshold is plotted as a function of the layer thickness difference but that layer has the same thickness of 40 Å for all the plots on this graph.

The next greater switching threshold shown, 52, is the dynamic threshold for thicker layer 12, 13 when both this thicker layer and the thinner layer have the magnetizations thereof opposed to the direction of the applied word line field. As a result, there is no inhibiting effect from the magnetization of the thin layer on the magnetization change of the thicker layer so that both switch as a result of the applied field. However, switching threshold 52 is shown as a function of increasing thickness of the thicker layer to thereby result in an increasing thickness difference between the thicker and the thinner layer. Clearly, the switching threshold increases significantly for the thicker layer as the difference of thicknesses in the two layers increases. The final switching characteristic, 53, represents the situation in which the thinner layer is already switched to be directed in the same direction as the applied word line field so as to inhibit the switching of the magnetization of the thicker layer. Again, switching characteristic 53 is plotted as a function of the increasing thickness difference between the layers.

As can be seen, the dynamic switching threshold plots for the thinner layer cross the dynamic switching threshold plots for the thicker layer as the thickness differences between the two layers sufficiently decrease. In this situation, there is clearly a substantial risk of having the directions of magnetization in both the thicker and thinner layer switch together in response to the application of a step function change in the word line current. As the thickness difference between the layers increases, an increasing gap develops between the switching thresholds for the thinner layer and the switching thresholds for the thicker layer thus providing a margin of safety in avoiding the switching of the thicker layer in response to a step-function change in the word line current intended to switch only the direction of the magnetization of the thinner layer.

FIG. 7B shows dynamic switching thresholds of the same nature as those shown in FIG. 7A except they are found in connection with the use of a greater sense current, so in FIG. 7B the threshold designation numerals matching those used in FIG. 7A are followed by a prime mark to result in being designated 51', 52', 53' and 54'. Switching thresholds in FIG. 7B are established on the basis of a greater sense current, here providing the field of 25 Oe, as compared to the sense current used in finding the switching thresholds shown in FIG. 7A where the sense current field was only 15 Oe. Clearly, the use of a larger magnitude sense current results in a greater safety margin at lower thickness differences between the thinner layer switching thresholds and the thicker layer switching thresholds.

Thus, the thickness difference between the ferromagnetic thin-films used in a bit structure 17 must be sufficiently great, for the magnitude of the sense current and the structure geometrical parameters used, to assure that the application of a word line field intended to switch the tinner layer does not also have the effect of an unintended switching of the thicker layer also. In many situations, the thickness difference between the ferromagnetic thin-film layers will need to exceed at least 10% of the average of these two thicknesses.

The energy equations above, based on the ellipsoidal approximations described there for bit structure 17 meeting the foregoing limitations, can be minimized to find the equilibrium angular positions of the ferromagnetic layer magnetizations as a function of the applied sense, bias and word line current generated fields, and to find the quasi-static field thresholds. Necessary conditions for such an energy minimum are $$\tau_1 = \frac{\partial}{\partial \theta_1} E_{Tot} = 0$$

and $$\tau_2 = \frac{\partial}{\partial \theta_2} E_{Tot} = 0.$$

Taking the derivative with respect to $\theta_1$ to find the torque $\tau_1$ and setting the result equal to zero as indicated in the equation for that torque above yields $$= [H_{k1}M_{s1} + 4\pi M_{s1}^2 T_1(F_L - F_W)]V_1\sin(\theta_1)\cos(\theta_1) -$$

$$H_w M_{s1} V_1 \sin(\theta_1) - (S_1 H_s - H_b) M_{s1} V_1 \cos(\theta_1) +$$

$$H_e M_{s-avg} V_1 \frac{T_{avg}}{T_1}(\theta_1 + \theta - T_2 4\pi F_W M_{s1} M_{s2} V_1 \cos(\theta_1) \sin(\theta_2) -$$

$$T_2 4\pi F_L M_{s1} M_{s2} V_1 \sin(\theta_1) \cos(\theta_2)$$

$$= 0$$

using $V_x = AT_x$, with A being the surface area of the ferromagnetic layers, and $V_{avg} = AT_{avg}$ where the parameter $T_{avg}$ is $$T_{avg} = \frac{T_1 + T_2}{2}.$$

Similarly, the derivative with respect $\theta_2$ of the total energy to provide the torque $\tau_2$ and setting it equal to zero as indicated above yields $$\tau_2 = [H_{k2} M_{s2} + 4\pi M_{s2}^2 T_2 (F_L - F_W)] V_2 \sin(\theta_2) \cos(\theta_2) -$$

$$H_w M_{s2} V_2 \sin(\theta_2) - (S_2 H_s + H_b) M_{s2} V_2 \cos(\theta_2) +$$

$$H_e M_{s-avg} V_2 \frac{T_{avg}}{T_2} \sin(\theta_1 + \theta - T_1 4\pi F_W M_{s1} M_{s2} V_2 \sin(\theta_1) \cos(\theta_2) -$$

$$T_1 4\pi F_L M_{s1} M_{s2} V_2 \cos(\theta_1) \sin(\theta_2) = 0.$$

A possibility for determining the equilibrium angles and the switching thresholds is to use one of these torque equations to eliminate the dependence in the total energy equation on either one of the magnetization direction rotational angles, and then find the second derivative of the energy and set it to zero to determine the point in which the system is going from a stable equilibrium to an unstable one, i.e. the switching point, yielding $$\frac{d^2 E_{tot}(\theta_x)}{d\theta_x^2} = 0.$$

Alternatively, the two torque equations can be solved self-consistently to obtain the desired solutions. Furthermore, the resistance characteristics for the corresponding bit structure can be plotted versus applied word line current generated field which closely match those shown in FIGS. 3, 4A and 4B using these results and $$R = R_0 + \Delta R \sin\left(\frac{\theta_1 - \theta_2}{2}\right).$$

The "sandwich" structure for memory cells 17 described in the foregoing is extendable into a superlattice arrangement with the addition thereon of further alternating non-magnetic and magnetic layers. The result of the addition of one other nonmagnetic layer onto magnetic material composite layer 12', 13', and of a further magnetic material composite layer thereon, results in the layer diagrams shown in FIG. 8 as an extension of the "sandwich" structure layer diagram of FIG. 2. Fabrication of such structures as shown in FIG. 8 is based on the same steps that were used in fabricating the structure of FIG. 2 but with the addition of further depositions of a nonmagnetic and a magnetic layers essentially accomplished in the manner described above for depositing similar layers in the structure of FIG. 2.

Figure 8C:
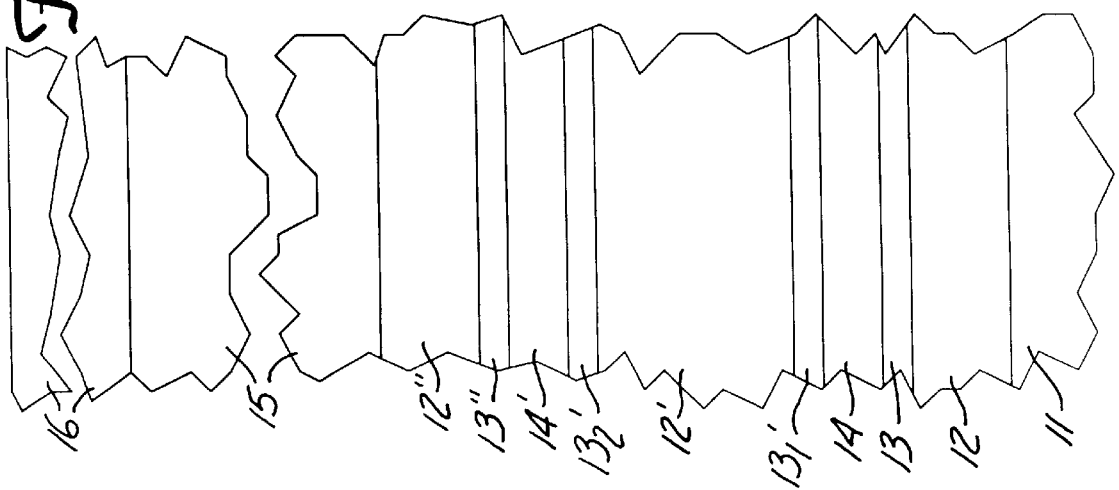
FIGS. 8A, 8B and 8C represents a fragmentary portion of a layer diagram of alternative embodiments of the present invention.
Figure 8B:
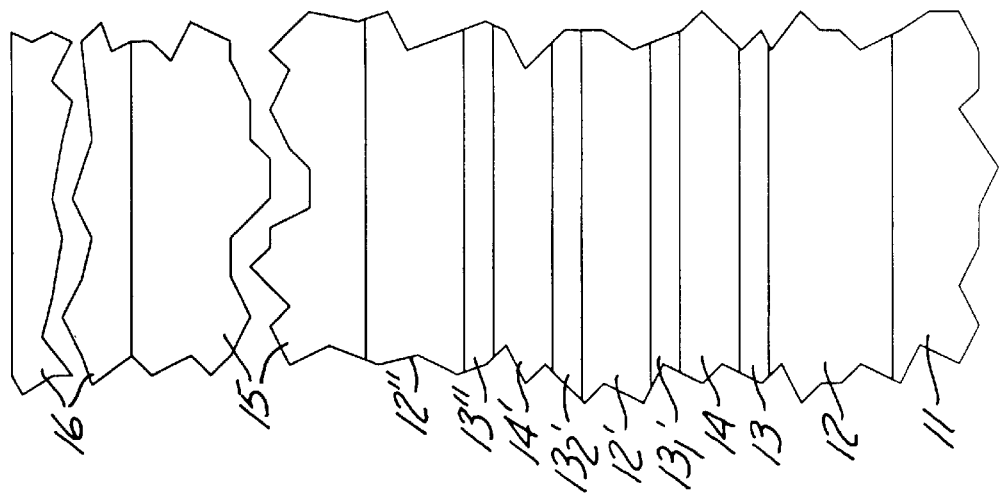
Figure 8A:
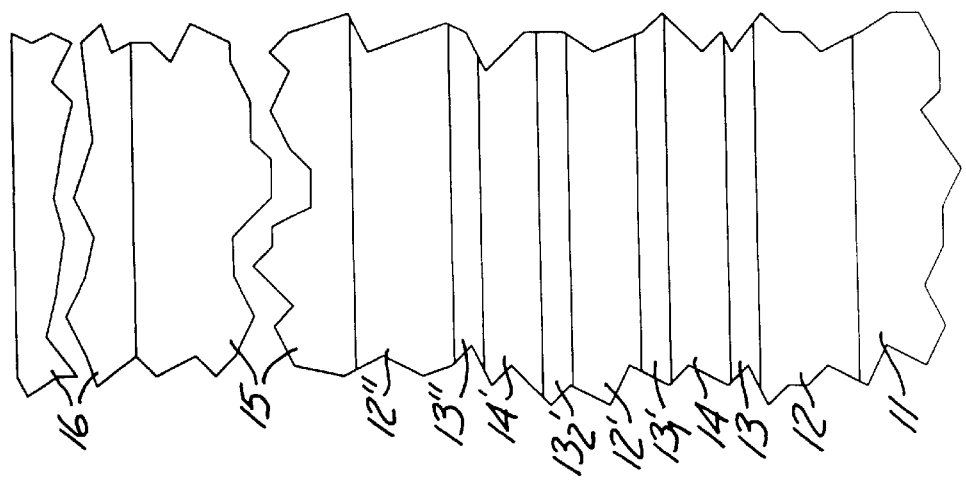

Thus, in FIG. 8A, the magnetic material composite layer 12', 13' of the cell structure in FIG. 2 is extended in FIG. 8A by redesignating stratum 13' of FIG. 2 as $13_1$' in FIG. 8A, and sputter depositing a further stratum, $13_2$', on the opposite side of stratum 12' to form a three strata magnetic material composite layer 12', $13_1$', $13_2$'. Again, both of strata $13_1$' and $13_2$' are formed of an alloy of 5% iron and 95% cobalt to a thickness of 15 Å to provide a magnetic material having a large magnetic saturation induction compared to the material of stratum 12'. A further nonmagnetic layer, 14', is formed by sputter depositing copper to a thickness of 30 Å on stratum $13_2$'. A third magnetic material composite layer is then provided on nonmagnetic layer 14' starting with sputter depositing a stratum, 13", of 5% iron and 95% cobalt to a thickness of 15 Å. Thereafter, the remainder of the layer is sputter deposited in a further stratum, 12", to a thickness of 40 Å using an alloy of 65% nickel, 15% iron, and 20% cobalt. Tantalum or tantalum nitride layer 15 and chrome silicon layer 16 are then shown on top of the resulting magnetic material composite layer 12", 13" where they are provided in the same manner as they were provided in the structure of FIG. 2.

The addition of a third magnetic material composite layer separated by a nonmagnetic layer from the portions of the earlier "sandwich" structure results in providing a ratio of resistance change to the nominal resistance of the FIG. 8A structure as the result of applying a magnetic field thereto which is approximately twice the same ratio for a corresponding "sandwich" structure. This increased ratio is thought due to the diffuse scattering surfaces for conduction electrons at the outer sides of memory cells 17 being separated by about twice the distance in the cell structure of FIG. 8A as occurs in a "sandwich" structure having comparable layer thicknesses.

Three alternative magnetization-resistivity states are possible for a memory cell structure 17 based on the symmetrical structure shown in FIG. 8A in which there are three magnetic material composite layers of equal thickness with adjacent ones thereof being separated by one of two nonmagnetic layers which are equal in thickness to one another, these states depending on the direction of the magnetization in each of the three magnetic material layers. The magnetization in each of the composite layers may be in substantially the same direction as in each of the remaining two layers to thereby provide the device magnetization-resistance state having the lowest resistance value. A second state of increased resistivity follows from having the magnetization of one of the outer layers oriented in a direction opposite that of the direction of the magnetizations of the other two layers. A final state occurs by having the direction of magnetizations of each of the outer layers opposite that of the direction of magnetization of the interior layer to thereby provide the greatest device resistivity value.

Applying word line current based magnetic fields and sense line current based magnetic fields to switch the layer magnetization directions as was done above for the "sandwich" structure based memory cells to reach these various states can, however, fail to reach the desired results. The interior layer will switch last in the presence of magnetic fields provided by a word line current and a sense current traversing the cell structure, if at all, because such a sense current will provide little or no net torque on the magnetization of the interior layer due to the symmetry of the sense current flow on either side of the interior layer in the structure of FIG. 8A. That is, the sense current is primarily carried in the two magnetic layers 14 and 14', and it is divided approximately in half in each given the symmetry of the structure.

Since the sense current in the structure of FIG. 8A does not provide any, or very little, aid in switching the magnetization of magnetic material composite layer 12', $13_1$', $13_2$', a pair of word lines is typically required about each memory cell 17 based on that structure to coincidently each provide a sufficient magnetic field to result in the sum thereof being great enough to force such switching of the magnetization direction of the interior layer. The switching field thresholds for a memory cell structure 17 based on the structure of FIG. 8A can be reduced by skewing the easy access of the interior and possibly the outer magnetic material composite layers therein from extending along the lengths thereof to instead extending at an angle of 15 to 25°, as an example, away from the length axis of the memory cell structure.

A determination of whether the magnetization of the interior layer points in one or the other direction along the memory cell length, as the basis for a FIG. 8A based memory cell structure storing a "0" or a "1" digital value therein, can be accomplished much as described above in connection with "sandwich" structure based memory cells. A magnetic field is generated by current directed through one of the word lines present in a FIG. 8A based cell structure that is sufficiently large to force the magnetizations of each of the outer layers to being in a common direction. This word line current value is chosen as the starting point from which the sensing circuitry is prepared through the "autozeroing" process to take a resistance measurement based on the cell voltage change established by the sense current following a subsequent word line based magnetic field change. This subsequent field change comes about by reversing the current in that word line to direct the magnetic field associated therewith in the opposite direction through the cell, and the sensing circuitry concurrently determines whether the change in voltage across the memory cell structure is positive or negative which depends on the direction of magnetization of the interior layer.

A memory cell 17 based on the structure shown in FIG. 8A is again intended to have dimensions on the order of those for the "sandwich" structure based cells described above, that is, of dimensions such that the cell layer demagnetization fields are on the order of or greater than the anisotropy fields occurring in the magnetic material composite layers. As a result, a memory cell structure 17 based on the structure shown in FIG. 8A will typically have a resistance versus magnetic field characteristic similar to that shown in FIG. 4B (except for an added step or plateau in the resistance characteristic portion where the resistance is increasing with magnetic field magnitude due to one outer layer switching ahead of the other) in which the demagnetization fields are dominant and, as a result, force two of the magnetic material composite layers to have their magnetizations oriented in a common direction opposite that of the magnetization of the remaining magnetic material layer. The result is the occurrence of a high resistivity state at zero applied word line magnetic fields. Again, of course, the higher end of the range of dimensions for the memory cell structures in which the demagnetizing fields match or just slightly dominate the anisotropy fields can still result in the characteristics shown in FIG. 4A if there is sufficient exchange and surface textural variation coupling present.

In those situations in which the demagnetizing fields force an anti-parallel alignment of the direction of magnetizations of two of the layers versus the direction of magnetization of the third in a zero applied word line field, just which two of the layers have their magnetizations oriented in a direction opposite the third will be something of happenstance for memory cells based on the structure of FIG. 8A. That is, though there will be a tendency for two of the layers to have magnetizations in a direction opposing that of the third, the structure of FIG. 8A of three magnetic material composite layers of equal thicknesses will result in subtle and uncontrolled structural variations causing two of these composite layers in the cell to have their magnetizations pair in a common direction opposing that of the magnetization of the remaining layer. These uncontrolled structural variations may result in a different such pairing of layers from cell to cell, or from device chip to device chip, or from wafer of chips to wafer of chips.

Such a more or less random result can be avoided by introducing asymmetries in the structure of the magnetic material composite layers and the nonmagnetic layers therebetween to more reliably set which two layers will have their magnetizations pointing more or less in the same direction. Some asymmetries can also affect the actions of the imposed magnetic fields such as having different thicknesses for the nonmagnetic layers 14 and 14' to result in a net torque on the interior layer due to the resulting unevenly divided sense current. The interior layer could also be formed of a different magnetic material or materials to achieve a higher saturation magnetization relative to the outer layers.

FIGS. 8B and 8C show two further asymmetry structural arrangements based on different thicknesses for the magnetic material composite layers present. FIG. 8B has one of the outer magnetic material composite layers, composite layer 12, 13, of a thickness greater than that of the remaining two composite layers. FIG. 8C shows a structure with interior magnetic material composite layer 12', $13_1$', $13_2$' alternatively being thicker than either of the two outer magnetic material composite layers, 12, 13 and 12", 13". This providing of one of the three magnetic material composite layers in a memory cell structure 17 that is thicker than the others remaining leads to the demagnetizing fields therein forcing those magnetizations in the remaining two layers into a common direction opposite the direction of magnetization of the thicker composite layer. These structures inherently have, or can be made to have, structural asymmetries which lead to a further alternative magnetization-resistivity state beyond the three which occur in connection with the symmetrical structure of FIG. 8A because the cell resistivities can differ in these circumstances for two situations of the thinner layers having their magnetizations pointing in opposite directions.

FIG. 9A shows a plan view a fragmentary portion of a monolithic integrated circuit containing an example of memory cells used as part of a digital memory similar to that shown in FIG. 1A but with the addition of a second word line, 60, also being shown therein along with a change in the sense line layout pattern involving slanting the cells 17 to accommodate this second word line. Also indicated in FIG. 9A is a broken cut line indicating the location of the view for corresponding FIG. 9B which is a fragmentary section view of a portion of the plan view shown in FIG. 9A to show the layered structure thereof in correspondence with FIG. 1B. FIG. 9B incorporates memory cell structures 17 based on the structures shown in FIG. 8C, and the breaks in the view therein corresponding the the broken cut line in FIG. 9A are indicated by vertical dashed lines.

Semiconductor chip 10 and electrical insulating layer 11 shown in fragmentary part in FIG. 1B have been omitted from view in FIG. 9B. Instead, a portion of word line 60 which is provided on electrical insulating layer 11 is shown in FIG. 9B with a further 7500 Å silicon nitride insulating layer, 61, shown deposited thereover to be the support for cells 17. Word line 60 is again a metal deposition of aluminum alloy with 2% copper deposited to a thickness of 3500 Å. Alternatively, both word lines 22 and 60 can be positioned above memory cells 17, such as in the patterns shown, along with a "keeper" structure of highly permeable material above both word lines at crossovers thereof above each cell.

A further possibility for memory cells 17 based on the FIG. 8C structure is to form the interior composite layer so as to have the same volume as the combined outer composite layers, i.e. have the interior layer twice as thick as each of the two exterior layer thicknesses which are equal in thickness one another. In this configuration, with the easy axis of the magnetic material composite layers oriented along the length of the memory cell structure 17 in which they are provided (although the easy axis could be provided across the memory cell or skewed with respect to the length of the cell if it has a sufficiently small associated field), and with sufficient exchange and surface textural variation coupling provided, the length of memory cell structures 17 can be adjusted to result in two different but stable magnetization-resistivity states that occur without any changing of the equilibrium direction of the magnetization of the interior composite layer.

In this result, the cell length is such that the demagnetization fields are dominant in those situations in which the outer layers have had their magnetizations switched to a direction opposite that of the magnetization of the interior layer to thereby maintain that magnetization state in the absence of externally applied fields. On the other hand, in those situations where externally applied fields have switched magnetizations of the outer magnetic material composite layers to match the direction of the magnetization of the interior layer, the length of memory cell structures 17 and their magnetic matching are also such that the demagnetization fields are dominated by the exchange and surface variation of texture coupling so as to maintain that magnetization state in the absence of an externally applied magnetic field.

Thus, a memory cell structure can be provided in which two distinctive but stable magnetization-resistivity states can occur for use in for storing information, and do so without the need to switch the direction of magnetization of the interior layer as the basis for having such a pair of different stable magnetization states. Rather, information can be stored by placing the exterior layers in either a state of magnetization having a common direction opposite that of the magnetization direction of the interior layer, or in a state in which their magnetizations are in the same direction as that of the interior layer.

Figure 10:
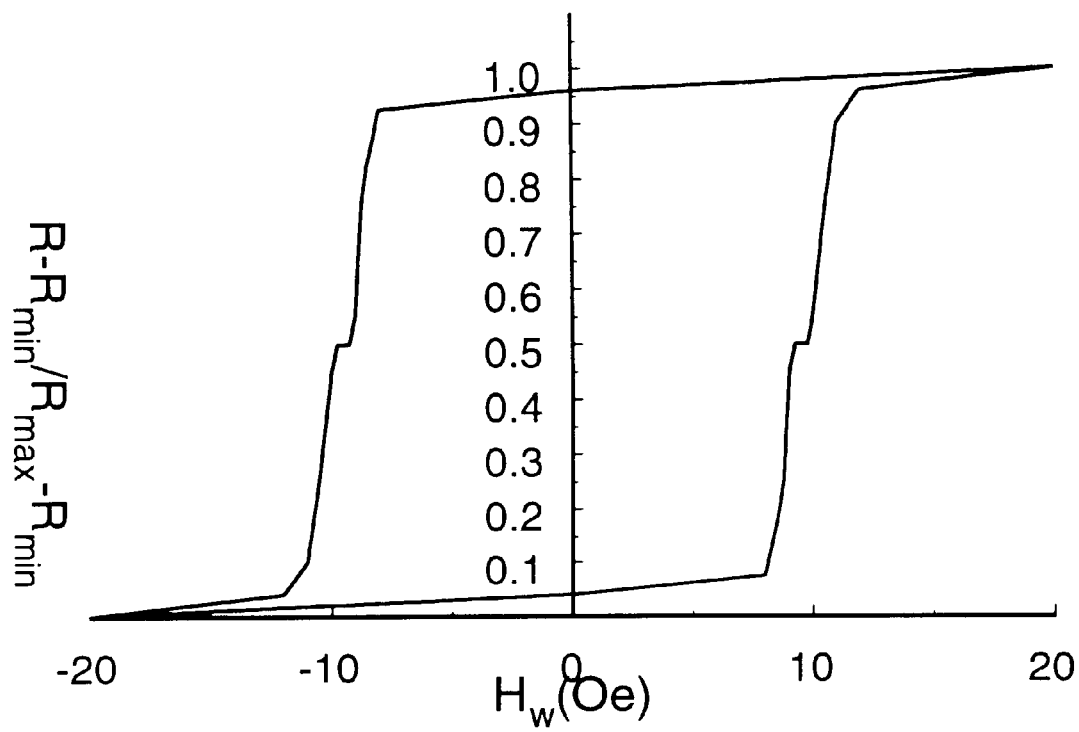

Such a device has a magnetization-resistance characteristic which exhibits a very substantial minor loop characteristic as can be seen in the line graph of normalized cell resistance versus applied external magnetic field shown in FIG. 10. Such normalization of the resistance values is achieved by subtracting the minimum resistance of the memory cell from the actual resistance and then dividing this difference by the difference between the maximum resistance and the minimum resistance which occurs. The characteristic often results from the cell length becoming such that more than one domain occurs in the magnetic material composite layers therein. The characteristic of FIG. 10 corresponds to one direction of magnetization of the interior layer, and a reversal of that interior layer direction of magnetization will result in a second such characteristic for the cell which would appear substantially to be the characteristic shown in FIG. 10 rotated about the vertical axis shown there. Which of these two loop characteristics is the actual operating characteristic thus depends on the direction of magnetization of the interior layer.

The lower left hand position on the characteristic of FIG. 10 corresponding to an externally applied substantial negative word line field results from the three magnetic layers having their magnetizations in a common direction to give the cell its smallest resistance value. Increasing the word line field magnitude to a zero value causes the cell situation to follow the lower branch of the loop, but the resistance remains nearly the same so that there is a stable state near the lowest resistance value in the absence of an externally applied field. Continuing to increase the externally applied magnetic field in magnitude, a positive value word line magnetic field is reached that is sufficient to force a first outer magnetic layer to switch its magnetization direction to the opposite direction as is seen occurring at the first plateau in this branch. Further increases in the word line field subsequently forces the second outer magnetic layer to switch its magnetization direction to the opposite direction as is seen occurring at the second plateau in this branch at which the maximum cell resistance is reached.

Thereafter, reducing the applied field results in the cell situation following along the opposite branch of the characteristic, and a zero field value is reached with little change in resistance from the maximum value reached. Thus, there is another a stable state near the highest resistance value in the absence of an externally applied field. Continued reduction of the field value leads to the second outer magnetic layer being forced to switch its magnetization direction to the original direction it was in, and further leads to the first outer layer thereafter being forced to switch its magnetization direction also to thereby position the cell situation at the original position on the characteristic. Thus, at zero applied field, a simple resistance measurement suffices to determine which of the two magnetization-resistivity states the cell is currently in.

These various magnetic structures described above based on FIG. 8 can again, from thermodynamic considerations, have determined therefor the equilibrium states of magnetization which occur at the free energy minimums for those structures. The total free energy of a bit structure or memory cell 17, based on a structure of the three magnetic material composite layers with separating nonmagnetic layers shown in FIG. 8, can generally be given as $$E_{tot} = E_1 + E_2 + E_3 + E_{12} + E_{23} + E_{13}.$$

The magnetic self-energies of the first, second and third layers are represented by $E_1$, $E_2$ and $E_3$, respectively. The magnetic interactions between the various layers are represented by $E_{12}$ for the interaction between the first and second layers, $E_{23}$ for the interaction between the second and third layers, and $E_{13}$ for the interaction between the first and third layers.

As before, a reasonable approximation for the structure of a memory cell 17 is made for the very small ferromagnetic thin-film layers therein that each is of a single domain allowing the assumption that the magnetization of a layer changes only by rotation, and that these layers exhibit uniaxial anisotropy. However, this approximation may not hold in the situation of the structure of FIG. 8C involving two alternative stable of states of magnetization without changes in the magnetization direction of the interior layer. As described above, this capability is achieved by matching the volume of the interior layer to the sum of the volumes of the outer two layers (or matching their magnetizations) and extending the length of the memory cell structure 17 sufficiently to reduce the demagnetizing fields enough thereby possibly introducing multiple domains. Thus, the following analytical framework for cells based on the structure shown in FIG. 8 applies in the other instances described above in situations, where other reasonable approximations such as the absence of magnetostriction are also appropriate, to result in a reasonably accurate analytical representation of the behavior of a bit structure or memory cell 17 based on a structure shown in FIG. 8.

The ellipsoid approximation represented in FIG. 5B will again be used but the magnetization vector there of $M_2$ at an angle $\theta_2$ to the cell length axis is now designated magnetization vector $M_3$ at an angle $\theta_3$. The magnetization vector $M_2$ will be considered added to the diagram of FIG. 5B in extending from the center of the dashed line horizontal and vertical axes and rotated upward for a positive angle between the horizontal dashed line axis in that vector of $\theta_2$.

These approximations allow the foregoing self-energies to be written as $$E_1 = \frac{H_{k1} M_{s1} V_1}{2} \sin^2\theta_1 + \frac{4\pi T_1 F_w M_{s1}^2 V_1}{2} \sin^2\theta_1 - \frac{4\pi T_1 F_L M_{s1}^2 V_1}{2} \sin^2\theta_1 + H_w M_{s1} V_1 \cos\theta_1 - (S_1 H_s - H_b) M_{s1} V_1 \sin\theta_1,$$

$$E_2 = \frac{H_{k2} M_{s2} V_2}{2} \sin^2\theta_2 + \frac{4\pi T_2 F_w M_{s2}^2 V_2}{2} \sin^2\theta_2 - \frac{4\pi T_2 F_L M_{s2}^2 V_2}{2} \sin^2\theta_2 + H_w M_{s2} V_2 \cos\theta_2 - (S_2 H_s - H_b) M_{s2} V_2 \sin\theta_2,$$

and $$E_3 = \frac{H_{k3} M_{s3} V_3}{2} \sin^2\theta_3 + \frac{4\pi T_3 F_w M_{s3}^2 V_3}{2} \sin^2\theta_3 - \frac{4\pi T_3 F_L M_{s3}^2 V_3}{2} \sin^2\theta_3 + H_w M_{s3} V_3 \cos\theta_3 - (S_3 H_s - H_b) M_{s3} V_3 \sin\theta_3.$$

The layer interactive energies are $$E_{12} = -M_{s-avg;1,2} V_{avg} H_e K \cos(\theta_2 - \theta_1) +$$

-continued $$\frac{V_1 T_2 + V_2 T_1}{2} 4\pi F_w M_{s1} M_{s2} \sin\theta_1 \sin\theta_2 -$$

$$\frac{V_1 T_2 + V_2 T_1}{2} 4\pi F_L M_{s1} M_{s2} \cos\theta_1 \cos\theta_2,$$

$$E_{23} = -M_{s-avg;2,3} V_{avg} H_e \cos(\theta_2 + \theta_3) -$$

$$\frac{V_2 T_3 + V_3 T_2}{2} 4\pi F_w M_{s2} M_{s3} \sin\theta_2 \sin\theta_3 -$$

$$\frac{V_2 T_3 + V_3 T_2}{2} 4\pi F_L M_{s2} M_{s3} \cos\theta_2 \cos\theta_3,$$

and $$E_{13} = -\frac{V_1 T_3 + V_3 T_1}{2} 4\pi F_w M_{s1} M_{s3} \sin\theta_1 \sin\theta_3 -$$

$$\frac{V_1 T_3 + V_3 T_1}{2} 4\pi F_L M_{s1} M_{s3} \cos\theta_1 \cos\theta_3.$$

The various terms in these expressions have the same general meanings they had in connection with the earlier expressions for the total energy in a two magnetic material composite layer structure but taking into account the added layer and the added layer interactions. There are some additions and changes, however. The factor K has been added for computational convenience, taking on the value of $-1$ for $\theta_1 + \theta_2 > \pi$ but otherwise equaling 1. The expressions for the average volume for all three magnetic material composite layers, and for the average magnetizations, $M_{s-avg;n_1,n_2}$, of the various pairs of interacting layers, now become $$V_{avg} = \frac{V_1 + V_2 + V_3}{3},$$

and $$M_{s-avg;n_1,n_2} = \frac{M_{sn_1} T_{n_1} + M_{sn_2} T_{n_2}}{T_{n_1} + T_{n_2}}.$$

The width and length limitations of memory cells 17 based on the FIG. 2 structure again hold for memory cells 17 based on the FIG. 8 structures represented by these equations given just above. That is, the width limitations with respect to curling lengths and with respect to demagnetization fields versus anisotropy fields, and the length limitations in connection with heat dissipation and the formation of Néel ferromagnetic layer walls, are maintained for these memory cell structures 17 also. The possible limitation on magnetic layer thickness in situations of high rates of applied external magnetic field changes causing significant oscillation or "ringing" in the magnetic layers magnetization directions will be set out below.

As before, the energy equations set out above, meeting the foregoing limitations, can be minimized to find the equilibrium angular positions of the ferromagnetic layer magnetizations as a function of the applied magnetic fields generated by sense, bias and word line currents to thereby fine the quasi-static field thresholds. Taking the derivatives of the energy equations with respect to $\theta_1$ to find torque $\tau_1$, the derivative with respect to $\theta_2$ to find the torque $\tau_2$, and the derivative with respect to $\theta_3$ to find the torque $\tau_3$, and setting each such torque to zero gives the following result:

$$\tau_1 = [H_{k1} M_{s1} + 4\pi M_{s1}^2 T_1 (F_w - F_L)] V_1 \sin\theta_1 \cos\theta_1 - H_w M_{s1} V_1 \sin\theta_1 -$$

-continued $$(S_1 H_s - H_b) M_{s1} V_1 \cos\theta_1 - H_e K M_{s-avg;1,2} V_1 \frac{T_{avg}}{T_1} \sin(\theta_2 - \theta_1) +$$

$$T_2 4\pi F_w M_{s1} M_{s2} V_1 \cos\theta_1 \sin\theta_2 - T_3 4\pi F_w M_{s1} M_{s3} V_1 \cos\theta_1 \sin\theta_3 -$$

$$T_2 4\pi F_L M_{s1} M_{s2} V_1 \sin\theta_1 \cos\theta_2 - T_3 4\pi F_L M_{s1} M_{s3} V_1 \sin\theta_1 \cos\theta_3 = 0,$$

$$\tau_2 = [H_{k2} M_{s2} + 4\pi M_{s2}^2 T_2 (F_w - F_L)] V_2 \sin\theta_2 \cos\theta_2 -$$

$$H_w M_{s2} V_2 \sin\theta_2 - (S_2 H_s - C H_b) M_{s2} V_2 \cos\theta_2 -$$

$$H_e V_2 \frac{T_{avg}}{T_2} [M_{s-avg;1,2} K \sin(\theta_2 - \theta_1) + M_{s-avg;2,3} \sin(\theta_2 + \theta_3)] +$$

$$T_1 4\pi F_w M_{s1} M_{s2} V_2 \sin\theta_1 \cos\theta_2 - T_3 4\pi F_w M_{s2} M_{s3} V_2 \cos\theta_1 \sin\theta_3 -$$

$$T_1 4\pi F_L M_{s1} M_{s2} V_2 \cos\theta_1 \sin\theta_2 - T_3 4\pi F_L M_{s1} M_{s3} V_2 \sin\theta_2 \cos\theta_3 = 0,$$

and $$\tau_3 = [H_{k3} + 4\pi M_{s3}^2 T_3 (F_w - F_L)] V_3 \sin\theta_3 \cos\theta_3 - H_w M_{s3} V_3 \sin\theta_3 -$$

$$(S_3 H_s - H_b) M_{s3} V_3 \cos\theta_3 + H_e M_{s-avg;2,3} V_3 \frac{T_{avg}}{T_3} \sin(\theta_2 + \theta_3) -$$

$$T_1 4\pi F_w M_{s1} M_{s3} V_3 \sin\theta_1 \cos\theta_3 - T_2 4\pi F_w M_{s2} M_{s3} V_3 \sin\theta_2 \cos\theta_3 -$$

$$T_1 4\pi F_L M_{s1} M_{s3} V_3 \cos\theta_1 \sin\theta_3 - T_2 4\pi F_L M_{s2} M_{s3} V_3 \cos\theta_2 \sin\theta_3 = 0.$$

Here, the average magnetic layers thickness is now $$T_{avg} = \frac{T_1 + T_2 + T_3}{3}.$$

The factor C is again for computational convenience in being equal to −1 if $\theta_2 < 0$ but otherwise being 1. Again, these equations can be solved as above to represent the cell resistance versus applied magnetic field by use of the angles found therefrom for the various applied external fields.

Figure 11A:
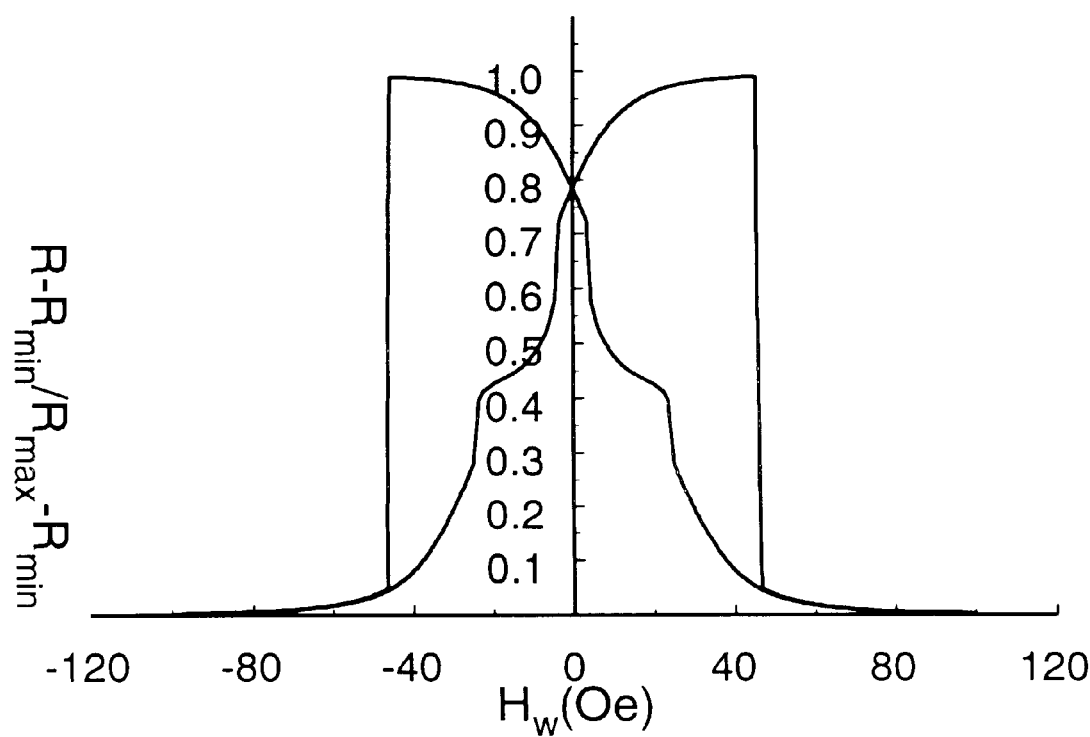

The resistance versus applied magnetic field characteristics for the single domain, three magnetic layer memory cell structures of FIG. 8 can exhibit a more varied behavior with increasing asymmetry in the magnetic layer thickness than do "sandwich" structures. Consider first such a three layer magnetic memory cell 17 having no substantial thickness differences between the magnetic material layers therein as in FIG. 8A, this structure provided in a cell having a length of approximately 2 μm and a width of approximately 0.4 μm. A resistance-magnetization characteristic therefor is shown in FIG. 11A for a device in which each of the magnetic material layers is 40 Å in total thickness, and in which one of the nonmagnetic layers is 30 Å thick and the other is 40 Å thick. The characteristic of FIG. 11A again has normalized resistance values shown on the vertical scale, again based on subtracting the minimum resistance of the memory cell from the actual resistance followed by dividing this difference by the difference between the cell maximum and minimum resistance.

If a substantial negative word line current based magnetic field is first applied followed by reducing this negative field to zero and then increasing it as a positive word line current based magnetic field, the cell operation follows the characteristic of lower value in the negative field portion of FIG. 11A which rises to the higher value characteristic in the positive field portion of FIG. 11A. Along this characteristic, the magnetizations in the three layers start out pointing in a common parallel direction until the negative field is sufficiently reduced for the magnetization of the first magnetic material layer to switch to a substantially reversed direction which occurs at the shallow plateau beginning at about −25 Oe. A further reduction in the magnitude of the negative word line field followed by an increase in the magnitude of the ensuing positive field leads to reaching a further plateau representing the switching of the direction of magnetization of a second magnetic material layer. Further increases in the positive magnetic field magnitude results in finally switching the magnetization directions of all three magnetic material layers to the direction opposite to that in which they initially pointed resulting in again a low resistance state shown by the sharp drop in the resistance value at approximately 45 Oe. A reducing of the magnitude of the positive field from this point leads to following the other characteristic shown in FIG. 11A. Thus, except for an added shallow plateau at an intermediate point in the characteristics, there is relatively little difference between a three magnetic layer cell of substantially equal magnetic material layer thicknesses and the above described "sandwich" structure characteristics earlier shown in FIGS. 3 and 4.

Figure 11B:
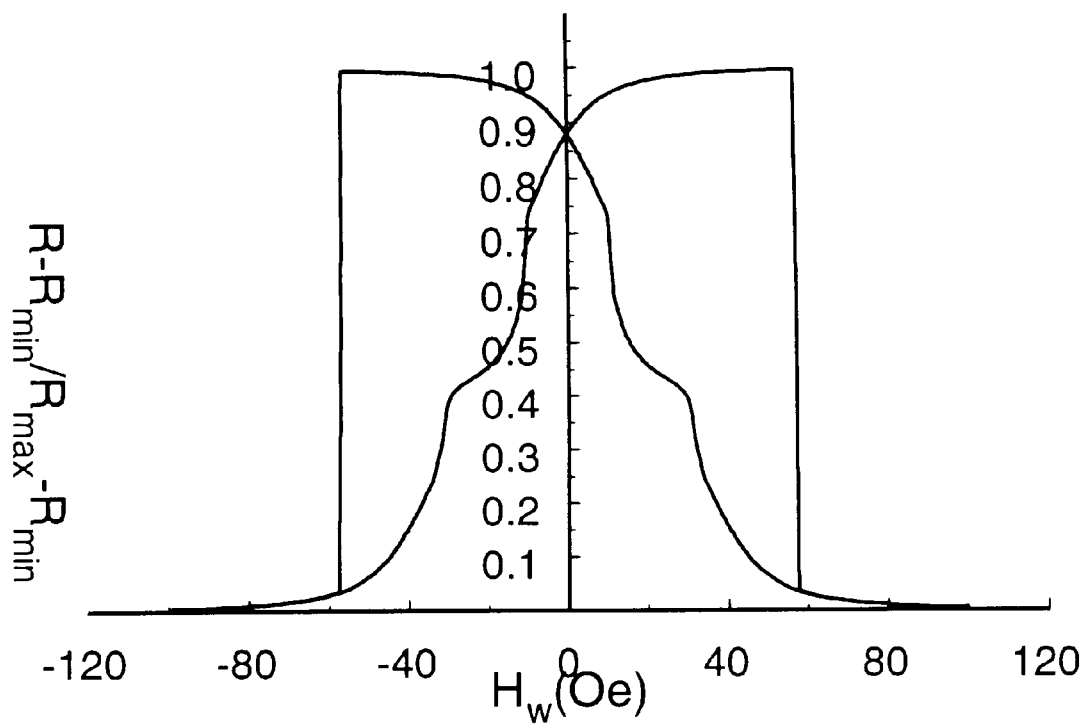
Figure 11C:
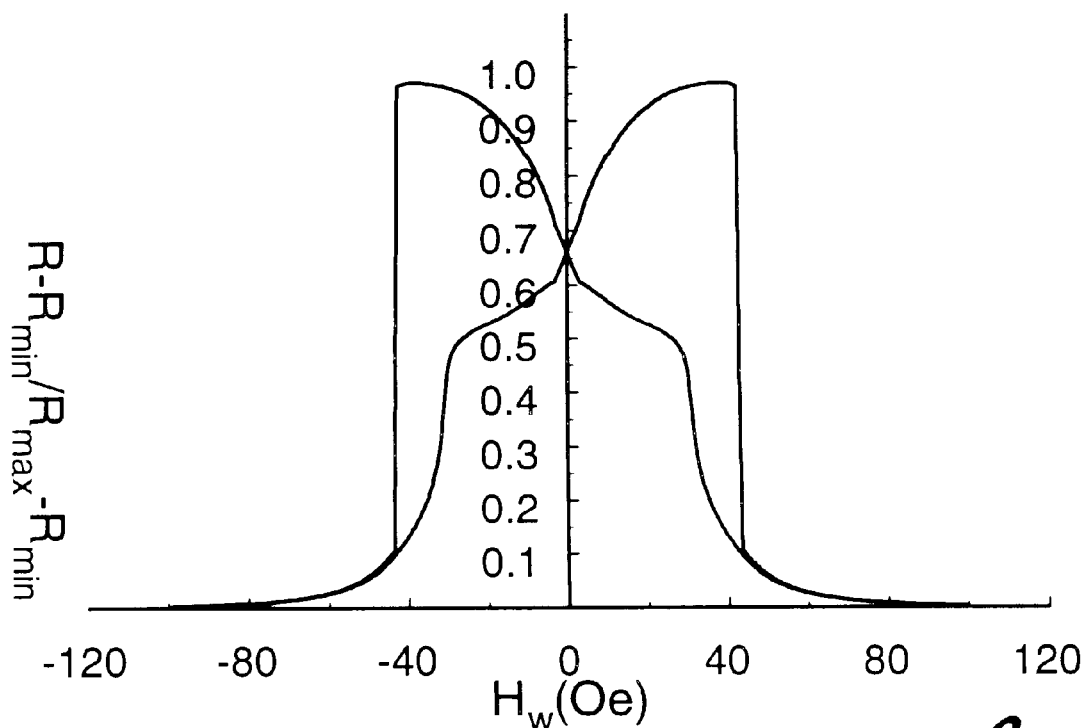

FIG. 11B shows a magnetization-resistance characteristic for a three magnetic layer memory cell 17 in which the two outer layers are each 40 Å thick but the central layer between them is 60 Å thick as in FIG. 8C. Again, one nonmagnetic layer is 30 Å thick, and the other is 40 Å thick. FIG. 11C shows a magnetization-resistance characteristic for a three magnetic layer memory cell 17 where one of the outer magnetic material layers is 60 Å thick and the two remaining magnetic material layers (the central layer and the other outer layer) are each 40 Å thick. The nonmagnetic layer between the thick outer and central magnetic material layers is 30 Å thick, and nonmagnetic layer between the thin outer and central magnetic material layers is 40 Å thick. Again, both the characteristics shown in these figures are fairly similar to those shown for "sandwich" structures above except for the presence of an added shallow plateau at an intermediate magnetic field magnitude representing the switching in the magnetization direction of a first one of the magnetic material layers.

The ratio of the thickness of the thicker magnetic material layer in the structures of FIGS. 8B and 8C to the thicknesses of the two thinner layers can be further increased from the ratio leading to the resistance-magnetization characteristics shown in FIGS. 11B and 11C of approximately 1½ to 1. Such further increases in the ratio of the thickness of the thick magnetic layer to the thicknesses of the two thin magnetic layers do not yield significant differences in the resistance-magnetization characteristics for the structure off FIG. 8C because the asymmetry in that structure caused by increasing the thickness of the middle layer does not appreciably change. On the other hand, increasing the thickness of the thicker layer in the structure of FIG. 8B with the thickness of the thicker outer layer approaching and exceeding twice the thickness of the two other magnetic layers leads to a fourth state in the corresponding resistance-magnetization characteristic as mentioned above.

Figure 12A:
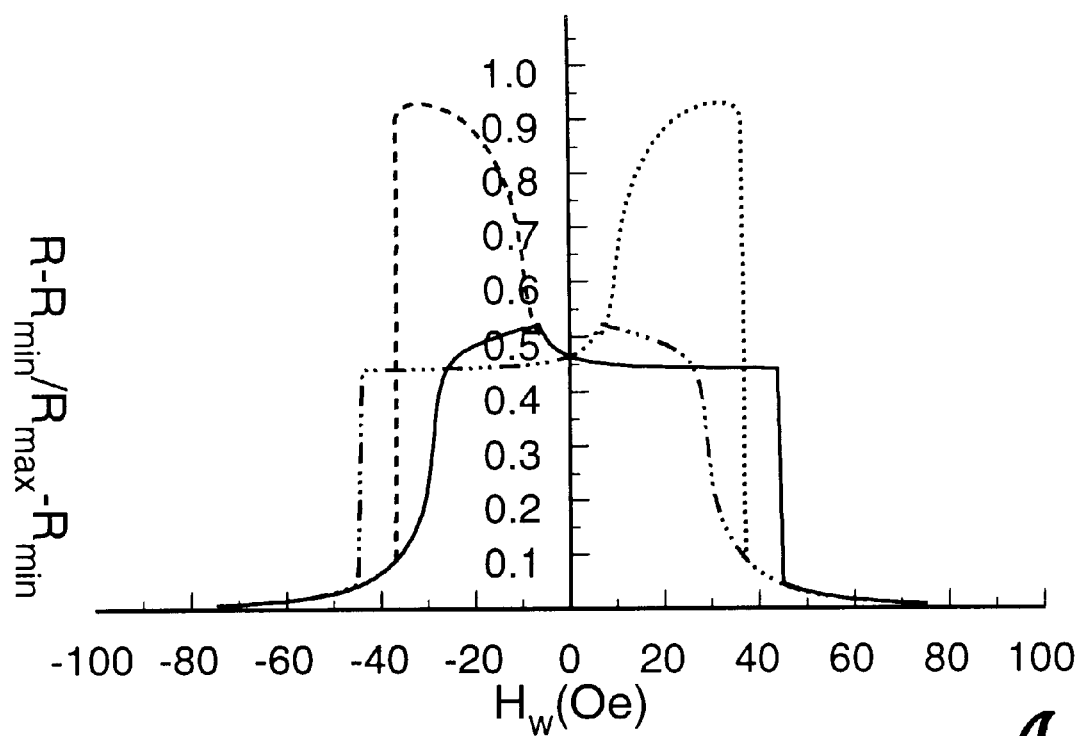

Thus, FIG. 12A shows a significantly altered magnetization-resistance characteristic for such a cell, this characteristic being of a memory cell 17 with a structure along the lines of that shown in FIG. 8B that is approximately 1.5 μm long and 0.3 μm wide. The thinner two magnetic material layers are each of a thickness of approximately 30 Å, and the thicker outer magnetic material layer has a thickness of approximately 70 Å, that is, this latter layer is more than twice as thick as either of the two thinner magnetic material layers. Again, the nonmagnetic layer adjacent the thicker magnetic material is 40 Å thick and the other is 30 Å thick.

Again assume that an initial negative word line current based magnetic field of approximately −60 Oe is applied so that the initial cell situation is on the solid line characteristic in the lower left-hand portion of FIG. 12A. In this situation, all three magnetic material layers have their magnetizations aligned in a common direction to give the lowest resistance state for the cell. Increasing the magnitude of the word line magnetic field to approximately −30 Oe leads to the magnetization direction of the thin outer layer reversing its direction and a corresponding increase in cell resistance to an intermediate resistance value state. Further increases in the applied magnetic field results in the second thin magnetic material layer reversing its direction of magnetization at approximately −8 Oe (the peak point in the solid line graph) which results in another intermediate resistance value state, but one of somewhat lower resistance value as the word line magnetic field continues to increase to reach a zero value.

Still further increases in the word line current based magnetic field result in that field becoming positive and then increasingly more positive, but this results in no further effect on the resistance value of the memory cell 17 until the thick magnetic material outer layer also switches its magnetization direction at approximately 45 Oe. Once such a switching of magnetization direction of the thick outer layer occurs, a subsequent decrease in the magnitude of the applied word line current based magnetic field results in the situation of memory cell 17 following the alternative characteristic shown which is represented by an alternating pattern of one long dash and three short dashes.

If, instead, the word line current based magnetic field is not increased after the switching of the second thinner magnetic material layer at approximately −8 O (the peak point on the solid line characteristic) to the point of switching the magnetization direction of the thicker layer, but is instead decreased to become (or remain and become) more negative, the magnetization direction of the outer thin magnetic material layer switches it back to the original direction it had (at −60 Oe). This last switching leads to a magnetization state in which the magnetizations of the two outer layers are pointed in the original direction with the inner thin magnetic material layer pointed in the direction reversed from the original, and to a fourth resistance state which is the state with the highest resistance value for the cell. The cell situation follows the long dashed line portion of the characteristic as the applied magnetic field becomes more negative until the interior thin magnetic material layer also switches back to the original direction of magnetization at approximately −37 Oe to place the cell again in the lowest resistance value state in which all three magnetizations point in the same original direction.

Thus, this memory cell has four separate resistance value magnetization-resistance characteristic states for the magnetization of the thicker magnetic material layer being maintained in a single direction. A similar situation occurs when the three magnetic material layers have their magnetizations pointed in a common direction but opposite to the original direction for the starting point described above. In this case, the cell operating situation follows along the characteristic having a long dashed line and three short dashed lines alternating pattern, as indicated above, unless switched into the corresponding cell highest resistance state in which the cell situation would follow the short dashed line characteristic portion shown in FIG. 12A.

Figure 12B:
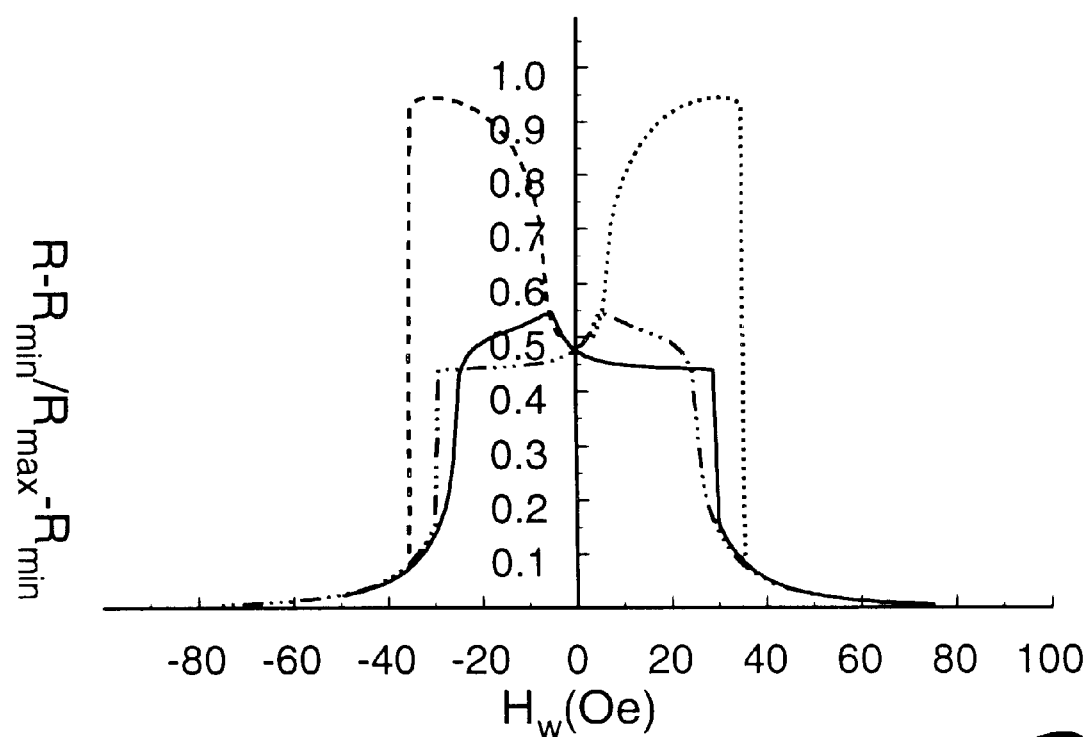

The ratio of the thickness of the thick outer magnetic material layer to the thicknesses of the two thinner magnetic material layers must be sufficiently great, as indicated above, to obtain the characteristic shown in FIG. 12A. A characteristic is sketched in FIG. 12B for a smaller thickness of the thicker outer magnetic material layer showing that the switching threshold for switching the direction of magnetization of that thicker layer is less in this configuration than the threshold for switching from the highest resistance value magnetization-resistance characteristic state to the lowest. As a result, a user of the cell would not know which of the two characteristics present in FIG. 12B, one for each direction of the magnetization of the thick outer magnetic material layer, was being followed by a memory cell 17 when a word line current based magnetic field was applied to determine the resistance state of the cell.

The greater thickness used for the thicker outer magnetic material layer in the cell yielding the characteristic of FIG. 12A allows such a word line current based magnetic field to be applied for state determination without changing the magnetization of the thicker outer magnetic material layer so as to avoid a destructive cell state determination. Increasing the thickness of the outer thicker magnetic material layer further than that used for the cell providing the characteristic of FIG. 12A allows a greater difference to be present between the value at which the direction of magnetization of the thicker layer switches and the threshold value at which the cell, after reaching the cell highest resistance state portion of the cell characteristic, changes from having a resistance value equal to the cell maximum resistance value to having a resistance value equal to approximately the cell minimum resistance value.

A desirable feature of the FIGS. 8B and 5C structures for a memory cell 17 over a "sandwich" structure for that cell, and for a FIG. 8B structure over a FIG. 5C structure for such a cell, is a reduction in the switching thresholds for changing the magnetization directions in the magnetic material layers. Such a reduction in switching thresholds allows the use of smaller currents in the word lines thereby allowing the fabrication of word lines of smaller physical dimensions without undue electromigration or other adverse effects of larger currents in the word line structures used. This can be seen from a comparison of three memory cells 17 of equal length and width but varying in internal structure with one having the "sandwich" structure of FIG. 2, one with the structure of FIG. 8B and the remaining one with the structure of FIG. 5C. Such a comparison generally shows that the highest switching thresholds are for cells of the FIG. 2 structure, with lower switching thresholds for cells with the FIG. 8C structure and the lowest switching thresholds for cells with the FIG. 8B structure. Some approximate values for cells with the FIG. 2 "sandwich" structure are a switching threshold of approximately 86 Oe for the thicker magnetic material layer having a thickness of 60 Å, a switching threshold of approximately 116 Oe for the thicker layer having a thickness of 70 Å, and a switching threshold of approximately 147 Oe for that layer having a 80 Å thickness. A FIG. 8C structure in the cell has a switching threshold for the thicker magnetic material center layer of approximately 76 Oe for a 60 Å thickness center layer, a switching threshold of approximately 96 Oe for a 70 Å thick center layer, and a switching threshold of approximately 119 Oe for an 80 Å thick center layer. The switching thresholds drop significantly for the cell using the FIG. 8B structure with a switching threshold of only 29 Oe for a thicker outer magnetic material layer of 60 Å thickness, a switching threshold of 44 Oe for a thicker outer layer having a thickness of 70 Å, and a switching threshold of 66 Oe for a thicker outer layer having a thickness of 80 Å. In each instance, the magnetic material layers in the memory cell which are not the thicker magnetic material layer for that cell have thicknesses of 30 Å.

Three magnetic material layer memory cell structures as described above appear to be less susceptible to the effects of applications of changing word line current based magnetic fields thereto based on abrupt changes in currents in the word lines giving rise to those fields. As before, the switching performance for memory cells based on these structures can be calculated from the three equations given above for the magnetization torques $\tau_1$, $\tau_2$ and $\tau_3$ in the three magnetic material layers of such cells in equilibrium or slowly changing field conditions ("static" conditions) when introduced into the Gilbert equation given above to provide dynamic equations suitable for determining cell behavior in rapidly changing field conditions ("dynamic" conditions). The behavior of magnetic layer magnetization vector angles taken with respect to the cell long axis are considered first for changes in the word line current based magnetic fields in which the rise time of the changes in the field magnitude are on the order of 1 ns, a rise (or fall) time which is typical of what can be provided by current switches fabricated in conventional monolithic integrated circuit constructions for memory cells 17.

Figure 13A:
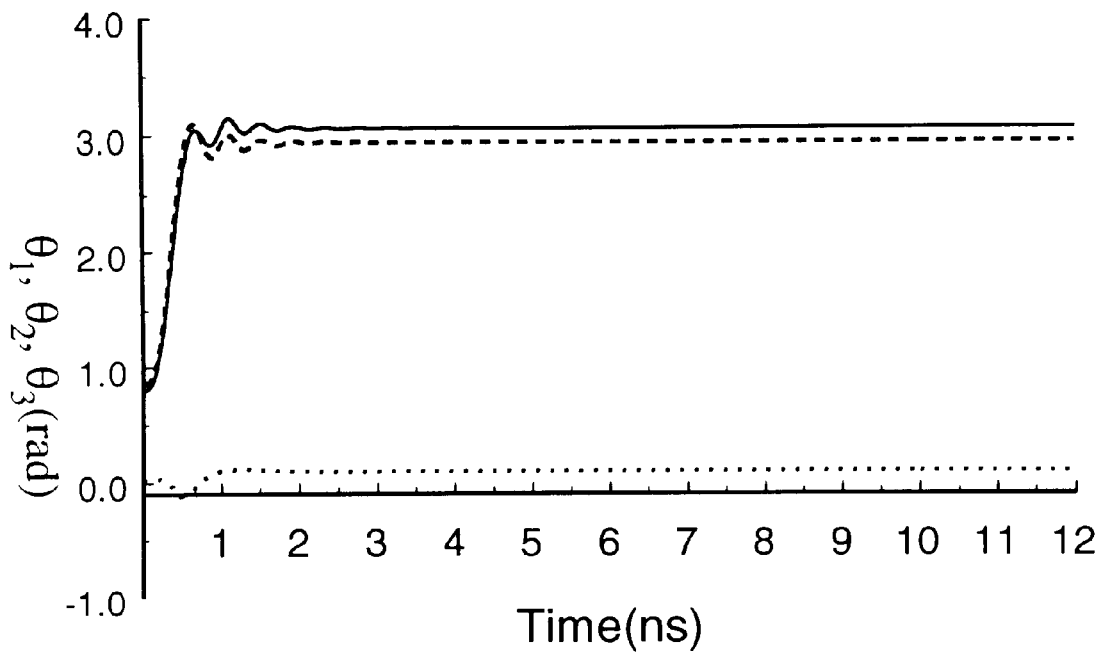
FIGS. 13A, 13B and 13C represents a graph of responses for a structure similar to that shown in FIG. 8C.

FIG. 13A shows the responses of the three magnetic material layers in a memory cell 17 having the FIG. 8C thicker center magnetic material structure substantially like that leading to the characteristic of FIG. 11B obtained from relatively slowly changing magnetic field applications, i.e. the basis for determining "static" magnetization direction reversal switching thresholds for the magnetic material layers in such a cell. In FIG. 13A, the word line current based magnetic field is changed from –40 Oe to 55 Oe with approximately the rise time given above. The two thinner outer magnetic material layers having magnetization direction angles $\theta_1$ and $\theta_3$, respectively, represented by the sold line plot and the plot line with long dashes, respectively, both switch their magnetization directions from the initial direction to the opposite direction. However, the thicker central magnetic material layer with magnetization direction angle $\theta_2$ as represented by the plot line with short dashes clearly does not switch its direction from its initial orientation in accord with 55 Oe being less than the static switching threshold value for that layer of approximately 58 Oe seen in FIG. 11B.

Figure 13B:
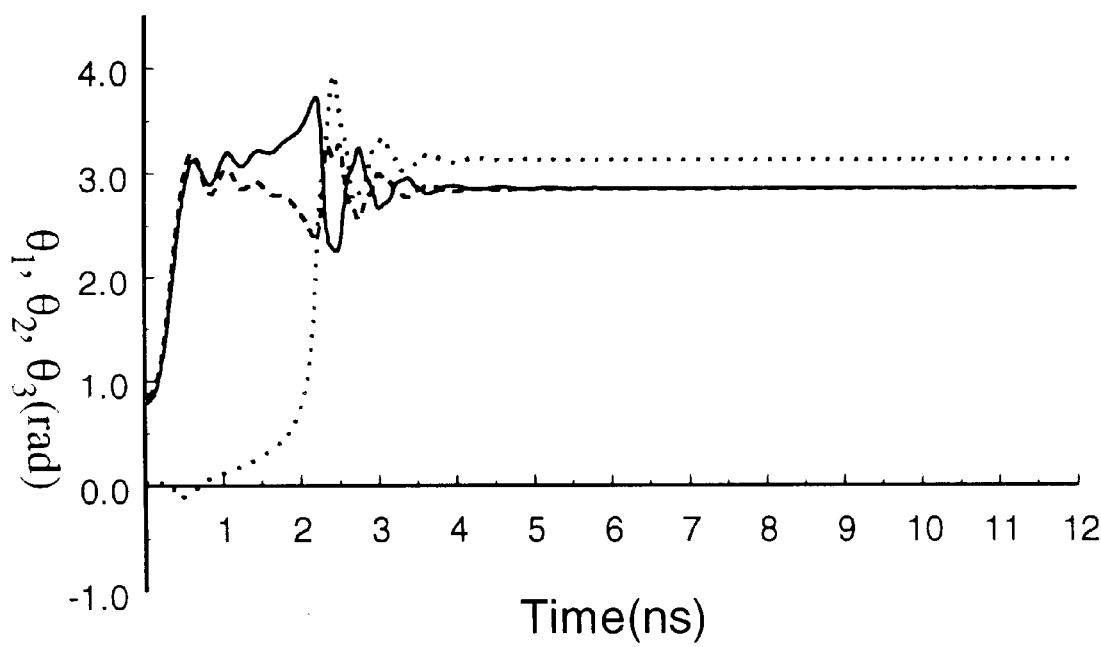

FIG. 13B shows the result for this same cell when the word line current based magnetic field is changed from –40 Oe to now 65 Oe with approximately the rise time given above to thereby exceed the switching threshold for the thicker central magnetic material layer of FIG. 11B. That is, the central thicker magnetic material layer now also switches its direction of magnetization but with some delay following the switching of the directions of magnetizations of the two thinner outer magnetic material layers. Clearly, the switching threshold for the static case shown in FIG. 11B of approximately 58 Oe is also the switching threshold in the dynamic case with the much higher rate of change in applying word line current based magnetic field with the results shown in FIGS. 13A and 13B.

Figure 14C:
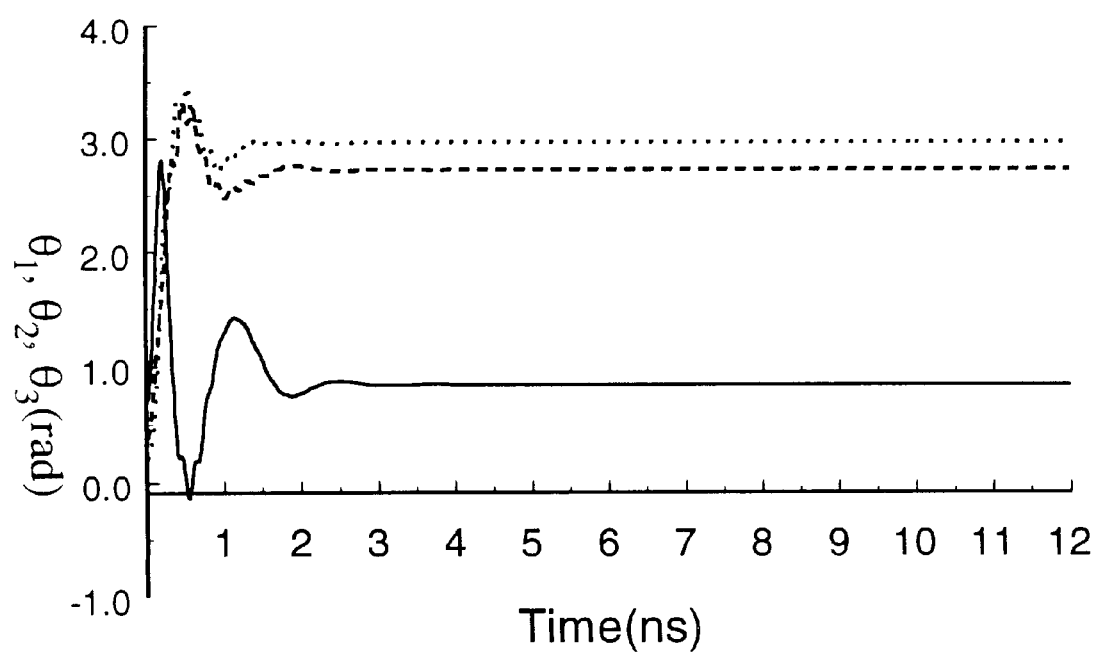
FIGS. 14A, 14B and 14C represents a graph of responses for a structure similar to that shown in FIG. 8B.
Figure 14A:
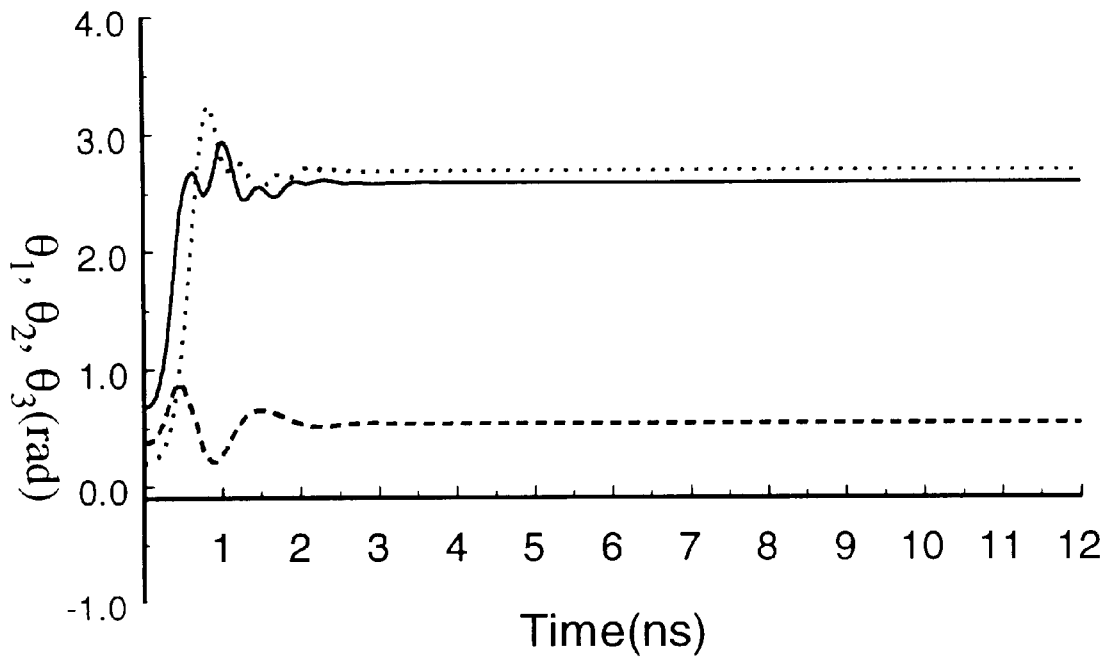
Figure 14B:
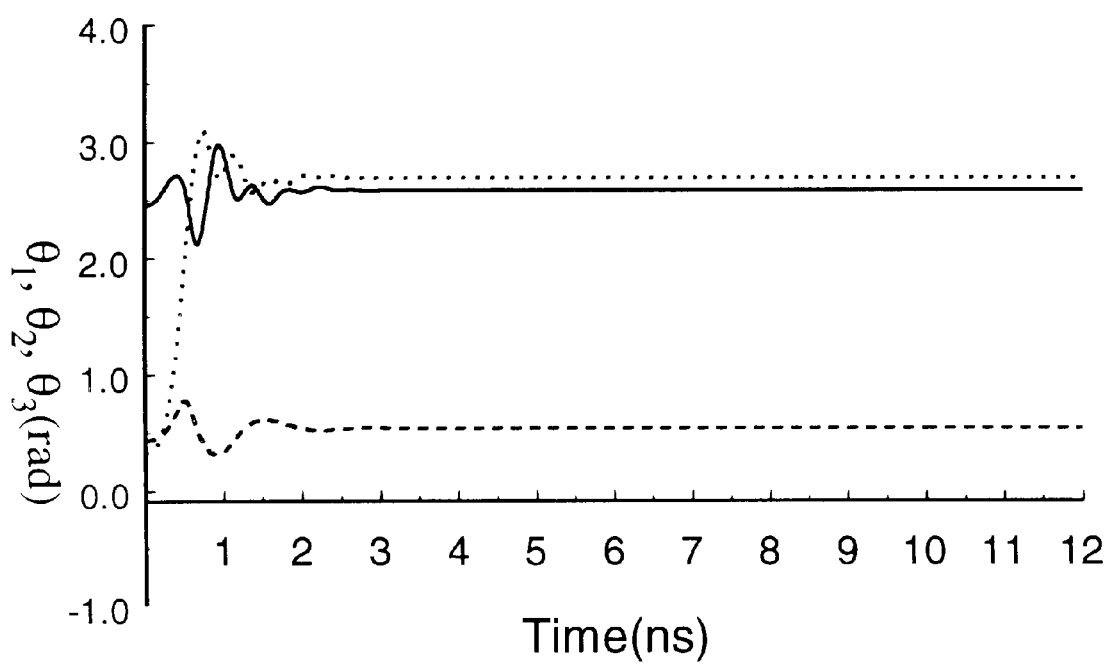

Some magnetization direction angle versus time results for the field change rise time given above are shown in FIGS. 14A and 14B for the FIG. 8B thicker outer magnetic material layer structure corresponding to the static characteristic of FIG. 12A. In FIG. 14A, the word line current based magnetic field is switched from –40 Oe to 40 Oe with approximately the rise time given above showing that the thinner outer layer angle $\theta_1$, represented by the solid line plot, and the thinner central layer angle $\theta_2$, represented by the line plot with short dashes, both switch the direction of magnetization therein to the reverse of the initial direction.

Again, however, the thicker outer magnetic material layer angle $\theta_3$, represented by the line plot with long dashes, does not switch thus leaving its magnetization remaining in nearly the same direction it had prior to application of the change in magnetic field. This is what would be expected from the static characteristic of FIG. 12A showing a switching threshold of approximately 45 Oe.

FIG. 14B shows the result for this same device when the word line current based magnetic field is changed from just –20 Oe to again 40 Oe with approximately the rise time given above to determine whether there would be a difference in the performance of the cell when the magnetic field change starts from a different point on the characteristic given therefor in FIG. 12A. Again, the thinner outer and central magnetic material layers switch to reverse their magnetization directions but the thicker outer magnetic material layer does not. Thus, the location where the abrupt change in the magnetic field begins on the characteristic of FIG. 12A does not make a difference in the corresponding cell in the effective value of the switching threshold for the thicker outer magnetic material layer. The application of a change in the word line current based magnetic field in either of these situations to a value exceeding 45 Oe leads to the reversing of the direction of magnetization of the thicker outer magnetic material layer as expected, and so has not been shown.

Figure 13C:
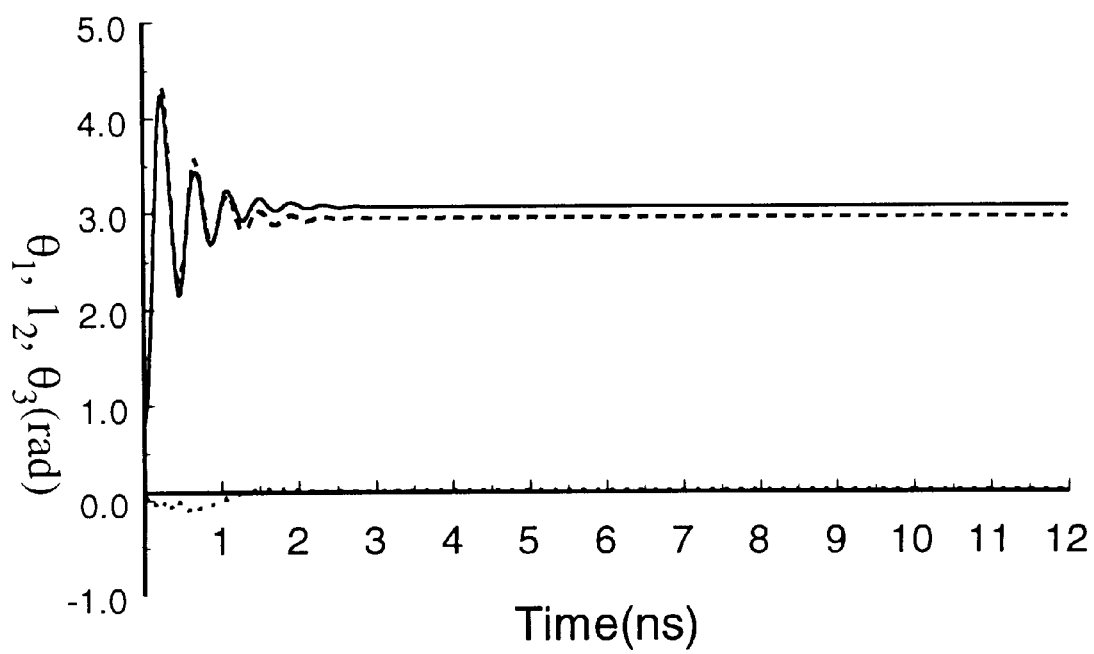

However, somewhat different results are obtained in the situation where word line current based magnetic field changes are applied with an even faster rise time in the situation involving the structure of FIG. 8B in which the thicker layer is an outer magnetic material layer, although not in the situation involving the structure of FIG. 8C in which the central layer is the thicker magnetic material layer. This latter situation is shown in FIG. 13C where again the thinner outer material layers for a FIG. 8C structure have been shown to switch their directions of magnetization, but not the thicker central layer, for a magnetic field change of –40 Oe to 55 Oe having a significantly faster rise time.

The situation for a memory cell with the structure of FIG. 8B, however, has a different result as is seen in FIG. 14C where the word line current based magnetic field is changed from –40 Oe to only 25 Oe with again a much shorter rise time. There, all three magnetic material layers switch their direction of magnetization initially, although the thin outer magnetic material layer magnetizations switches back to the original direction in this dynamic situation. A further application of such a magnetic field change, but with the change in the field starting at –20 Oe and rising to 35 Oe with a similarly short rise time did not cause switching of the magnetization direction of the thicker outer magnetic material layer indicating that where a magnetic field change starts on the cell static characteristic of FIG. 12A can affect the dynamic magnetic layer magnetization behavior as to whether the thicker outer magnetic material layer switches its magnetization at a value significantly below its static characteristic threshold.

Although the present invention has been described with reference to preferred embodiments, workers skilled in the art will recognize that changes may be made in form and detail without departing from the spirit and scope of the invention.

We claim:

1. A magnetoresistive, ferromagnetic thin-film based digital memory, said memory comprising:

a first storage line structure having a first storage line pair of end terminal regions suited to conduct electrical current in at least one direction therethrough, said storage line end terminal regions having electrically connected therebetween at least one bit structure, each said bit structure comprising:

a plurality of intermediate layers in a succession thereof, each said intermediate layer in said plurality thereof having two major surfaces on opposite sides thereof such that said major surfaces are separated by less than 50 Å; and a plurality of memory films of a magnetoresistive, anisotropic ferromagnetic material less than 100 Å thick with there being one of said memory films in said plurality thereof between each pair of successive said intermediate layers and one adjacent each of those outer said end major surfaces of those said intermediate layers positioned at opposite ends of said succession thereof, a said memory film in said plurality thereof being of a thickness greater than that of all others in said plurality thereof by at least 5% to there by primarily provide switching thresholds for magnetizations of said memory films of said plurality thereof that differ for said thicker memory film from those of other memory films remaining in said plurality thereof, said memory films in said plurality thereof having at least one stratum in each said memory film which is of a matching composition in each; and a word line structure each having a pair of word line end terminal regions adapted to conduct electrical current in at least one direction therethrough, said pair of word line end terminal regions having an electrical conductor electrically connected therebetween which is located across an electrical insulating layer from a said memory film on one of said major surfaces of said intermediate layer of a corresponding said bit structure.

2. The apparatus of claim 1 wherein a said bit structure has a length and a width substantially perpendicular thereto that is smaller in extent than said length, said memory film in a said bit structure being characterized by an anisotropy field, and said width being sufficiently small that demagnetization fields arising in said memory film in response to its saturation magnetization being oriented along that said width exceed in magnitude said anisotropy field.

3. The apparatus of claim 2 wherein said storage line end terminal regions have electrically connected in series therebetween a plurality of said bit structures with each said bit structure electrically connected at a bit juncture to at least one other said bit structure, and wherein said word line structure is in a plurality of word line structures each having a pair of word line and terminal regions adapted to conduct electrical current in at least one direction therethrough with each of said pairs of word line end terminal regions having an electrical conductor electrically connected therebetween which is located across an electrical insulating layer from said memory film on one of said major surfaces on said intermediate layer of a corresponding one of said bit structures, and wherein a second storage line structure is provided substantially matching said first storage line structure including corresponding positional relationships with said plurality of word line structures.

4. The apparatus of claim 1 wherein a said bit structure has a length along said first storage line structure and a width substantially perpendicular thereto that is smaller in extent than said length, and said bit structure further has a shaped end portion extending over a portion of said length in which said width gradually reduces to zero at an end thereof with at least part of said shaped end portion being covered by a said bit juncture, said shaped end portion having an extent parallel to said length covered by said bit juncture which is less in extent along said length than said bit structure is wide plus twice those widths of a Néel magnetic domain wall in said memory film in that said bit structure.

5. The apparatus of claim 4 wherein said storage line end terminal regions have electrically connected in series therebetween a plurality of said bit structures with each said bit structure electrically connected at a bit juncture to at least one other said bit structure, and wherein said word line structure is in a plurality of word line structures each having a pair of word line and terminal regions adapted to conduct electrical current in at least one direction therethrough with each of said pairs of word line end terminal regions having an electrical conductor electrically connected therebetween which is located across an electrical insulating layer from said memory film on one of said major surfaces on said intermediate layer of a corresponding one of said bit structures, and wherein a second storage line structure is provided substantially matching said first storage line structure including corresponding positional relationships with said plurality of word line structures.

6. The apparatus of claim 1 wherein said thicker memory film is at least twice as thick as each of said other memory films in said plurality thereof.

7. The apparatus of claim 6 wherein said thicker memory film is a said one of said memory films in said plurality thereof that is adjacent a said outer end major surface of one of those said intermediate layers positioned at opposite ends of said succession thereof.

8. The apparatus of claim 6 wherein said thicker memory film is a said one of said memory films in said plurality thereof that is positioned between two of said intermediate layers.

9. The apparatus of claim 1 wherein said storage line end terminal regions have electrically connected in series therebetween a plurality of said bit structures with each said bit structure electrically connected at a bit juncture to at least one other said bit structure, and wherein said word line structure is in a plurality of word line structures each having a pair of word line and terminal regions adapted to conduct electrical current in at least one direction therethrough with each of said pairs of word line end terminal regions having an electrical conductor electrically connected therebetween which is located across an electrical insulating layer from said memory film on one of said major surfaces on said intermediate layer of a corresponding one of said bit structures, and wherein a second storage line structure is provided substantially matching said first storage line structure including corresponding positional relationships with said plurality of word line structures.

10. The apparatus of claim 1 wherein said memory film at each of said major surfaces of a said intermediate layer of at least one of said bit structures is arranged such that there are two separate films with one of said separate films on each of said major surfaces, and said bit structure has a length and a width substantially perpendicular thereto that is smaller in extent than said length, said width being less than about two curling lengths of said separate films from edges thereof substantially perpendicular to said width.

11. The apparatus of claim 1 wherein said memory film at each of said major surfaces is a composite film having a thinner stratum of higher magnetic saturation induction adjacent said intermediate layer and a thicker stratum of lower magnetic saturation induction.

12. The apparatus of claim 1 wherein at least one of said plurality of intermediate layers is a nonmagnetic electrical conductor.

13. The apparatus of claim 1 wherein at least one of said plurality of intermediate layers is a nonmagnetic electrical insulator.

14. The apparatus of claim 1 wherein a said bit structure has a length and a width substantially perpendicular thereto that is smaller in extent than said length.

15. The apparatus of claim 14 wherein said bit structure further has a shaped end portion extending over a portion of said length in which said width gradually reduces to zero at an end thereof.

16. The apparatus of claim 14 wherein a ratio of said length to said width exceeds five.

17. A magnetoresistive, ferromagnetic thin-film based digital memory, said memory comprising:
    a first storage line structure having a first storage line pair of end terminal regions suited to conduct electrical current in at least one direction therethrough, said storage line end terminal regions having electrically connected therebetween at least one bit structure having a length and a width substantially perpendicular thereto that is smaller in extent than said length, each said bit structure comprising:
        a plurality of intermediate layers in a succession thereof, each said intermediate layer in said plurality thereof having two major surfaces on opposite sides thereof such that said major surfaces are separated by less than 50 Å; and
        a plurality of memory films of a magnetoresistive, anisotropic ferromagnetic material less than 100 Å thick with there being one of said memory films in said plurality thereof between each pair of successive said intermediate layers and one adjacent each of those outer said end major surfaces of those said intermediate layers positioned at opposite ends of said succession thereof, a said memory film in said plurality thereof being of a thickness greater than that of all others in said plurality thereof by at least 5% to thereby primarily provide switching thresholds for magnetizations of said memory films of said plurality thereof that differ for said thicker memory film from those of other memory films remaining in said plurality thereof, said width being sufficiently small that demagnetization fields arising in said memory film in response to its saturation magnetization being oriented along that said width exceed in magnitude said anisotropy field; and
    a word line structure having a pair of word line end terminal regions adapted to conduct electrical current in at least one direction therethrough, said air of word line end terminal regions having an electrical conductor electrically connected therebetween which is located across an electrical insulating layer from said memory film on one of said major surfaces of said intermediate layer of a corresponding said bit structure.

18. The apparatus of claim 17 wherein a said bit structure has a length along said first storage line structure and a shaped end portion extending over a portion of said length in which said width gradually reduces to zero at an end thereof with at least part of said shaped end portion being covered by a bit juncture, said shaped end portion having an extent parallel to said length covered by said bit juncture which is less in extent along said length than said bit structure is wide plus twice those widths of a Néel magnetic domain wall in said memory film in that said bit structure.

19. The apparatus of claim 18 wherein said storage line end terminal regions have electrically connected in series therebetween a plurality of said bit structures with each said bit structure electrically connected at a bit juncture to at least one other said bit structure, and wherein said word line structure is in a plurality of word line structures each having a pair of word line and terminal regions adapted to conduct electrical current in at least one direction therethrough with each of said pairs of word line end terminal regions having an electrical conductor electrically connected therebetween which is located across an electrical insulating layer from said memory film on one of said major surfaces on said intermediate layer of a corresponding one of said bit structures, and wherein a second storage line structure is provided substantially matching said first storage line structure including corresponding positional relationships with said plurality of word line structures.

20. The apparatus of claim 18 wherein a ratio of said length to said width exceeds five.

21. The apparatus of claim 17 wherein said thicker memory film is at least twice as thick as each of said other memory films in said plurality thereof.

22. The apparatus of claim 21 wherein said thicker memory film is a said one of said memory films in said plurality thereof that is adjacent a said outer end major surface of one of those said intermediate layers positioned at opposite ends of said succession thereof.

23. The apparatus of claim 21 wherein said thicker memory film is a said one of said memory films in said plurality thereof that is positioned between two of said intermediate layers.

24. The apparatus of claim 17 wherein said storage line end terminal regions have electrically connected in series therebetween a plurality of said bit structures with each said bit structure electrically connected at a bit juncture to at least one other said bit structure, and wherein said word line structure is in a plurality of word line structures each having a pair of word line and terminal regions adapted to conduct electrical current in at least one direction therethrough with each of said pairs of word line end terminal regions having an electrical conductor electrically connected therebetween which is located across an electrical insulating layer from said memory film on one of said major surfaces on said intermediate layer of a corresponding one of said bit structures and wherein a second storage line structure is provided substantially matching said first storage line structure including corresponding positional relationships with said plurality of word line structures.

25. The apparatus of claim 17 wherein said memory film at each of said major surfaces of a said intermediate layer of at least one of said bit structures is arranged such that there are two separate films with one of said separate films on each of said major surfaces, and said bit structure has said width being less than about two curling lengths of said separate films from edges thereof substantially perpendicular to said width.

26. The apparatus of claim 17 wherein said memory film at each of said major surfaces is a composite film having a thinner stratum of higher magnetic saturation induction adjacent said intermediate layer and a thicker stratum of lower magnetic saturation induction.

27. The apparatus of claim 17 wherein at least one of said plurality of intermediate layers is a nonmagnetic electrical conductor.

28. The apparatus of claim 17 wherein at least one of said plurality of intermediate layers is a nonmagnetic electrical insulator.

29. The apparatus of claim 17 wherein said bit structure further has a shaped end portion extending over a portion of said length in which said width gradually reduces to zero at an end thereof.

30. The apparatus of claim 17 wherein a said memory film in said plurality thereof is of a thickness greater than that of all others in said plurality thereof by at least 5%.

31. A magnetoresistive, ferromagnetic thin-film based digital memory structure having a length and a width substantially perpendicular thereto that is smaller in extent than said length, said memory structure comprising:

a plurality of intermediate layers in a succession thereof, each said intermediate layer in said plurality thereof having two major surfaces on opposite sides thereof such that said major surfaces are separated by less than 50 Å; and a plurality of memory films of a magnetoresistive, anisotropic ferromagnetic material less than 100 Å thick with there being one of said memory films in said plurality thereof between each pair of successive said intermediate layers and one adjacent each of those outer said end major surfaces of those said intermediate layers positioned at opposite ends of said succession thereof, a said memory film in said plurality thereof being of a thickness greater than that of all others in said plurality thereof, (a) said length of said memory structure, and (b) that ratio of volume of said thicker memory film to those combined volumes those of other memory films remaining in said plurality thereof and (c) compositions of said memory films all being selected to provide said structure with two stable magnetization states, absent externally supplied magnetic fields, for said direction of magnetization of said thicker memory film remaining substantially unchanged.

32. The apparatus of claim 31 wherein the thickness of one of a said magnetic film in said plurality thereof positioned between a pair of said intermediate layers is approximately twice as thick as are memory films in said plurality thereof positioned on either side thereof.

33. The apparatus of claim 31 wherein a said memory film in a said memory structure is characterized by an anisotropy field, and said width is sufficiently small that demagnetization fields arising in said memory film in response to its saturation magnetization being oriented along that said width exceed in magnitude said anisotropy field.

34. The apparatus of claim 31 wherein a said memory structure has a length along said first storage line structure and a shaped end portion extending over a portion of said length in which said width gradually reduces to zero at an end thereof with at least part of said shaped end portion being covered by an electrical interconnection, said shaped end portion having an extent parallel to said length covered by said electrical interconnection which is less in extent along said length than said memory structure is wide plus twice those widths of a Néel magnetic domain wall in said memory film in that said memory structure.

35. The apparatus of claim 31 wherein said memory film at each of said major surfaces of a said intermediate layer of at least one of said bit structures is arranged such that there are two separate films with one of said separate films on each of said major surfaces, and said memory structure has said width being less than about two curling lengths of said separate films from edges thereof substantially perpendicular to said width.

36. The apparatus of claim 31 wherein said memory film at each of said major surfaces is a composite film having a thinner stratum of higher magnetic saturation induction adjacent said intermediate layer and a thicker stratum of lower magnetic saturation induction.

37. The apparatus of claim 31 wherein at least one of said plurality of intermediate layers is a nonmagnetic electrical conductor.

38. The apparatus of claim 31 wherein at least one of said plurality of intermediate layers is a nonmagnetic electrical insulator.

39. The apparatus of claim 31 wherein said bit structure further has a shaped end portion extending over a portion of said length in which said width gradually reduces to zero at an end thereof.

40. The apparatus of claim 31 wherein a ratio of said length to said width exceeds five.

* * * * *

UNITED STATES PATENT AND TRADEMARK OFFICE
CERTIFICATE OF CORRECTION

PATENT NO. : 5,966,322
APPLICATION NO. : 08/923478
DATED : October 12, 1999
INVENTOR(S) : Arthur V. Pohm et al.

Page 1 of 1

It is certified that error appears in the above-identified patent and that said Letters Patent is hereby corrected as shown below:

Column 1, Line 14, insert the following paragraph between Cross-Reference To Related Application paragraph and Background of the Invention:

--This invention was made with Government support under Contract Number N00014-93-C-0251 awarded by the Ballistic Military Defense. The Government has certain rights in the invention.--

Signed and Sealed this

First Day of July, 2008

JON W. DUDAS
*Director of the United States Patent and Trademark Office*